(12) United States Patent
Schultz et al.

(10) Patent No.: US 11,277,100 B2
(45) Date of Patent: *Mar. 15, 2022

(54) MULTIPLE-STAGE POWER AMPLIFIERS IMPLEMENTED WITH MULTIPLE SEMICONDUCTOR TECHNOLOGIES

(71) Applicant: NXP USA, Inc., Austin, TX (US)

(72) Inventors: Joseph Gerard Schultz, Wheaton, IL (US); Enver Krvavac, Kildeer, IL (US); Olivier Lembeye, Saint Lys (FR); Cedric Cassan, Muret (FR); Kevin Kim, Gilbert, AZ (US); Jeffrey Kevin Jones, Chandler, AZ (US)

(73) Assignee: NXP USA, Inc., Austin, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/938,111

(22) Filed: Jul. 24, 2020

(65) Prior Publication Data

US 2020/0389130 A1 Dec. 10, 2020

Related U.S. Application Data

(63) Continuation of application No. 16/172,561, filed on Oct. 26, 2018, now Pat. No. 10,763,792.

(30) Foreign Application Priority Data

Nov. 6, 2017 (EP) .................................... 17306530

(51) Int. Cl.
*H03F 1/02* (2006.01)
*H03F 1/56* (2006.01)
(Continued)

(52) U.S. Cl.
CPC ........... *H03F 1/0288* (2013.01); *H01L 23/66* (2013.01); *H01L 29/2003* (2013.01);
(Continued)

(58) Field of Classification Search
CPC .......... H03F 1/0288; H03F 3/24; H03F 1/565; H03F 3/195; H03F 3/213; H03F 2200/54;
(Continued)

(56) References Cited

U.S. PATENT DOCUMENTS

| 8,611,834 B2 * | 12/2013 | Harris ................... H03F 1/0288 455/114.1 |
| 10,778,156 B2 * | 9/2020 | Seebacher ............... H01L 23/66 |

FOREIGN PATENT DOCUMENTS

| JP | 2012-023583 A | 2/2012 |
| WO | PCT-2011/039871 A1 | 4/2011 |

OTHER PUBLICATIONS

Camiade, Marc et al., "Highly Integrated S and C-band Internally-Matched Quasi-MMIC Power GaN Devices", Proceedings of the 7th European Microwave Integrated Circuits Conference, Oct. 29, 2012, pp. 643-646, IEEE, Piscataway, NJ, US.
(Continued)

*Primary Examiner* — Hieu P Nguyen
(74) *Attorney, Agent, or Firm* — Sherry W Gourlay

(57) ABSTRACT

A multiple-stage amplifier includes a driver stage die and a final stage die. The driver stage die includes a first type of semiconductor substrate (e.g., a silicon substrate), a first transistor, and an integrated portion of an interstage impedance matching circuit. A control terminal of the first transistor is electrically coupled to an RF signal input terminal of the driver stage die, and the integrated portion of the interstage impedance matching circuit is electrically coupled between a current-carrying terminal of the first transistor and an RF signal output terminal of the driver stage die. The second die includes a III-V semiconductor substrate (e.g., a GaN substrate) and a second transistor. A connection, which is a non-integrated portion of the interstage impedance matching circuit, is electrically coupled between the RF
(Continued)

signal output terminal of the driver stage die and an RF signal input terminal of the final stage die.

20 Claims, 9 Drawing Sheets

(51) Int. Cl.
*H03F 3/195* (2006.01)
*H03F 3/24* (2006.01)
*H01L 23/66* (2006.01)
*H03F 3/213* (2006.01)
*H04B 1/04* (2006.01)
*H01L 29/20* (2006.01)

(52) U.S. Cl.
CPC .............. *H03F 1/565* (2013.01); *H03F 3/195* (2013.01); *H03F 3/213* (2013.01); *H03F 3/24* (2013.01); *H04B 1/0458* (2013.01); *H01L 2223/665* (2013.01); *H01L 2223/6611* (2013.01); *H01L 2223/6644* (2013.01); *H01L 2223/6655* (2013.01); *H03F 2200/168* (2013.01); *H03F 2200/18* (2013.01); *H03F 2200/222* (2013.01); *H03F 2200/225* (2013.01); *H03F 2200/318* (2013.01); *H03F 2200/387* (2013.01); *H03F 2200/411* (2013.01); *H03F 2200/42* (2013.01); *H03F 2200/451* (2013.01); *H03F 2200/54* (2013.01); *H03F 2200/75* (2013.01); *H03F 2203/21103* (2013.01); *H03F 2203/21112* (2013.01)

(58) Field of Classification Search
CPC ....... H03F 2200/75; H03F 2203/21112; H03F 2200/318; H03F 2200/411; H03F 2200/451; H03F 2203/21103; H03F 2200/225; H03F 2200/42; H03F 2200/168; H03F 2200/18; H03F 2200/387; H03F 2200/222; H04B 1/0458; H01L 29/2003; H01L 23/66; H01L 2223/6644; H01L 2223/6611; H01L 2223/665; H01L 2223/6655
USPC ................... 330/307, 310–311, 98, 133, 150
See application file for complete search history.

(56) References Cited

OTHER PUBLICATIONS

Non Final Office Action; U.S. Appl. No. 16/938,027; 10 pages (dated Jun. 30, 2021).

\* cited by examiner

MULTIPLE-STAGE POWER AMPLIFIERS IMPLEMENTED WITH MULTIPLE SEMICONDUCTOR TECHNOLOGIES

CROSS-REFERENCE TO RELATED APPLICATIONS

This application is a continuation of co-pending, U.S. patent application Ser. No. 16/172,561, filed on Oct. 26, 2018, which claims priority under 35 U.S.C. § 119 to European Patent Application No. 17306530.1, filed on Nov. 6, 2017, the contents of which are incorporated by reference herein.

TECHNICAL FIELD

Embodiments of the subject matter described herein relate generally to multiple-stage power amplifiers.

BACKGROUND

Gallium nitride (GaN) power transistors are increasingly being utilized in high-power amplifier circuits for cellular base stations and other systems to increase efficiency and operating bandwidth. GaN transistors have proven to provide high amplifier performance due to their relatively high power density and relatively high unit current gain frequency, when compared with some of their silicon based counterparts. The higher power density allows for smaller die peripheries for a given level of output power. This may result in lower drain-source capacitance, $C_{DS}$, and higher output impedances with wider output bandwidth, when compared with silicon devices.

However, GaN transistors also have several disadvantages when compared with silicon based transistors. For example, the current cost of GaN is significantly higher than that of silicon, putting GaN die area and integration at a premium. Further, GaN transistor compression characteristics challenge digital pre-distortion linearization circuits. GaN transistors tend to have a relatively-slow, gradual amplitude compression, and the transmission phase exhibits an expansion during drive up.

Further still, the GaN input characteristics may significantly limit performance. More specifically, GaN input impedance tends to be very low with a high Q-factor, and the gate-source capacitance, $C_{GS}$, varies considerably over drive. In a Doherty power amplifier with a GaN main amplifier and a GaN peaking amplifier, the GaN peaking amplifier transitions between an off state and an on state depending on the radio frequency (RF) drive level and signal envelope. As these transitions occur, the input impedance exhibits a large variation and may be highly mismatched to a preceding 50 Ohm gain stage. This mismatch may produce considerable reflection and poor Input Return Loss (IRL). Further, the resulting restricted bandwidth on the input can limit the overall amplifier bandwidth. These and other characteristics of GaN transistors make them impractical or unsuitable for use in many conventional amplifier topologies.

BRIEF DESCRIPTION OF THE DRAWINGS

A more complete understanding of the subject matter may be derived by referring to the detailed description and claims when considered in conjunction with the following figures, wherein like reference numbers refer to similar elements throughout the figures.

DETAILED DESCRIPTION

Figure 1:
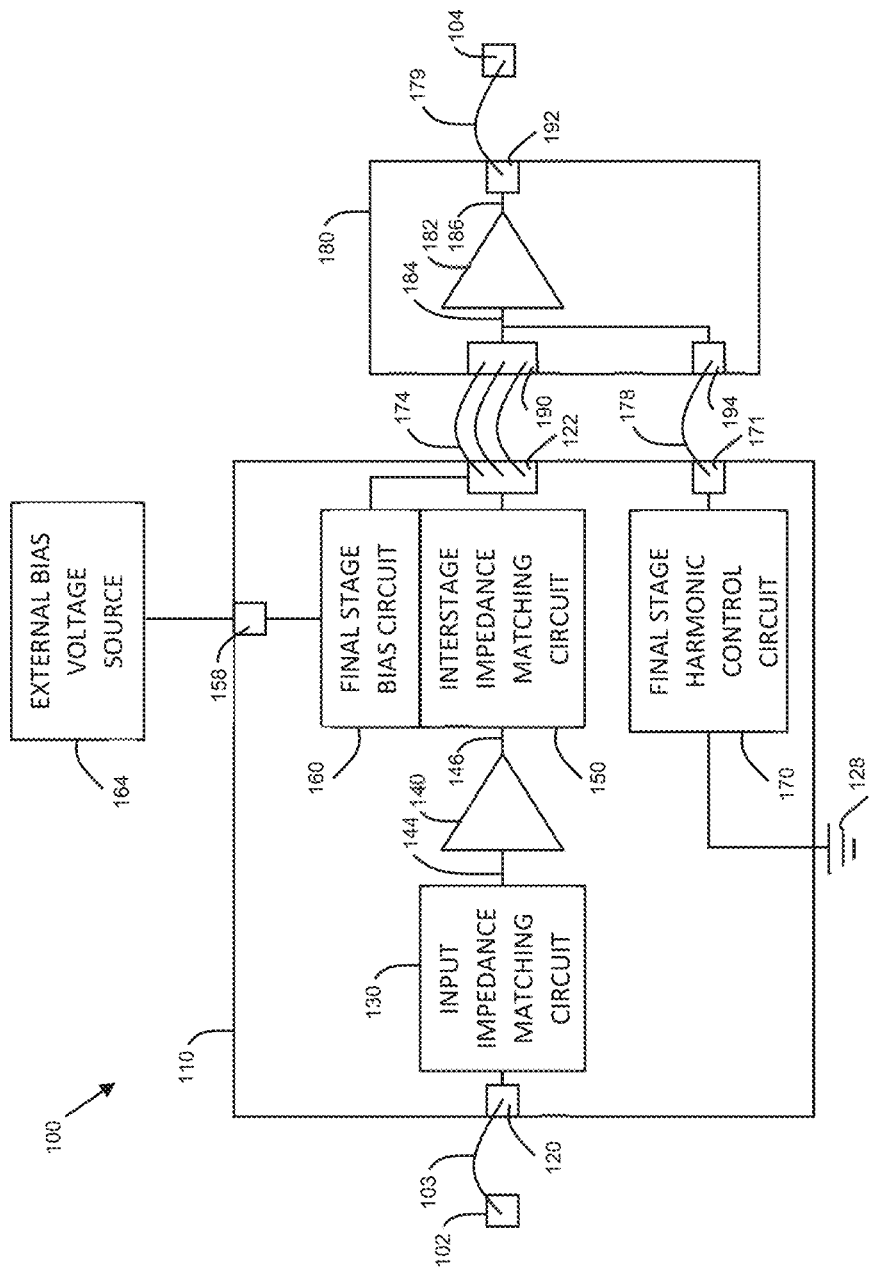
FIG. 1 is a simplified block diagram of a two-stage amplifier with a silicon driver stage and a GaN final stage, in accordance with an example embodiment.

Various embodiments of the inventive subject matter include a multiple-stage (e.g., cascade) amplifier with a silicon driver stage integrated circuit (IC) die and a III-V (e.g., GaN, gallium arsenide (GaAs), gallium phosphide (GaP), indium phosphide (InP), indium antimonide (InSb)) final stage IC die. More specific embodiments of a multiple-stage amplifier include a silicon driver stage IC die electrically coupled to a GaN final stage IC die in a cascade amplifier arrangement. The silicon driver stage IC die functions as a pre-match impedance conditioner and gain enhancer for the GaN final stage IC die.

The amplifier embodiments provided herein may overcome some or all of the aforementioned issues with GaN transistors, while potentially being significantly less expensive than, for example, a GaN driver-GaN final cascade amplifier arrangement. For example, whereas a typical GaN transistor, in isolation, has a slow gradual amplitude compression and the transmission phase exhibits an expansion during drive up, inclusion of a silicon driver stage IC die with a GaN final stage IC die in a cascade arrangement may improve the response, which in turn may result in an improved linear characteristic. The silicon driver stage IC die is used to terminate or shape the input RF waveforms to the GaN final stage IC die, in various embodiments, which may result in more optimal output waveforms. For example, the silicon driver stage IC die may help to condition and control gate shorts, which are usually applied to Class-F GaN amplifiers as the GaN transistor gate-source capacitance, Cgs, exhibits high non-linearity. Specifically, the silicon driver stage IC die may be used to compliment (or compensate for) the GaN gain and phase compression characteristics. Devices that utilize the various embodiments described herein may exhibit relatively flat gain and phase responses (AM/AM and AM/PM responses), when compared with conventional devices. Accordingly, digital pre-distortion (DPD) circuitry implemented prior to the amplifier embodiments in the transmit chain may be less complex and/or costly. Essentially, the composite amplifier embodiments discussed herein may have improved gain, broader bandwidth, and improved drive-up characteristics when compared with conventional single-stage and other two-stage amplifiers.

According to an embodiment, the electrical connection between the silicon driver stage IC die and the GaN final stage IC die is made with a series wirebond array at a low impedance point in the amplifier circuit. This wirebond array may provide a series inductance that matches well to the characteristically-low gate-source capacitance, $C_{GS}$ of the GaN final stage IC die. The wirebond array is a DC-coupled connection, in an embodiment, which facilitates the provision of both DC bias and RF signals from the silicon driver stage IC die to the GaN final stage IC die. In other embodiments, other types of DC-coupled electrical connections between the silicon driver stage IC die and the GaN final stage IC die could be implemented. Further, according to an embodiment, input and inter-stage matching circuits comprised of passive components (e.g., inductors, capacitors and resistors) are integrated into the relatively low-cost silicon driver stage IC die to transfer power to the GaN final stage IC die. In other words, the silicon driver stage IC die provides an integrated impedance match to the device chain.

GaN transistors commonly are depletion-mode, normally-on devices, which utilize specific bias voltage control circuit to generate a negative gate voltage to pinch the device off. According to some embodiments that include a depletion-mode GaN final stage IC die, the silicon driver stage IC die includes integrated GaN bias voltage control circuit, which is electrically coupled to the GaN final stage IC die, and which is configured to provide a negative gate voltage to pinch the device off. More specifically, in such an embodiment, the GaN bias voltage control circuit may be considered to be a GaN negative DC bias circuit (e.g., a direct current-to-direct current (DC-DC) voltage converter configured to convert a first (positive or negative) DC voltage to a negative DC voltage to be used as the GaN bias voltage). In other embodiments in which the GaN final stage IC die is an enhancement-mode, normally-off device, the silicon driver stage IC die may include integrated GaN bias voltage control circuit configured to provide a positive gate voltage to the GaN final stage IC die. More specifically, in such an embodiment, the GaN bias voltage control circuit may be considered to be a GaN positive DC bias circuit (e.g., a DC-DC voltage converter configured to convert a first (positive or negative) DC voltage to a positive DC voltage to be used as the GaN bias voltage). In either embodiment, the gate bias voltage for the GaN final stage IC die is provided by the silicon driver stage IC die. Integration of the GaN bias voltage control circuit into the silicon die, as opposed to the GaN die, may result in significant cost-reductions considering the lower cost of silicon die area in comparison to GaN die area.

GaN transistors are characterized by high frequency gain, along with a highly non-linear drain-source capacitance, $C_{DS}$, and gate-source capacitance, $C_{GS}$. According to some embodiments, the silicon driver IC die includes integrated gate and/or drain harmonic control circuitry, which is electrically coupled to the GaN final IC die. Again, integration of the gate and drain harmonic control circuitry on the silicon die, as opposed to the GaN die, may result in significant cost-reductions in light of the lower cost of silicon die area in comparison to GaN die area.

According to a specific embodiment, a GaN field effect transistor (FET) final stage IC die is connected to a silicon laterally-diffused, metal oxide semiconductor (LDMOS) driver stage IC die. According to another specific embodiment, a GaN FET final stage IC die is connected to a silicon complementary metal oxide semiconductor (CMOS) driver stage IC die.

The following detailed description is merely illustrative in nature and is not intended to limit the embodiments of the subject matter or the application and uses of such embodiments. As used herein, the words "exemplary" and "example" mean "serving as an example, instance, or illustration." Any implementation described herein as exemplary or an example is not necessarily to be construed as preferred or advantageous over other implementations. Furthermore, there is no intention to be bound by any expressed or implied theory presented in the preceding technical field, background, or the following detailed description.

As used herein, the term "transistor" means a field effect transistor (FET), a bipolar junction transistor (BJT), or another type of transistor. For example, a "FET" may be a metal-oxide-semiconductor FET (MOSFET), a laterally-diffused MOSFET (LDMOS FET), an enhancement-mode or depletion-mode high electron mobility transistor (HEMT), or another type of FET. The description below refers to a transistor as including a control terminal and two current-conducting terminals. For example, using terminology associated with FETs, a "control terminal" refers to a gate terminal of a transistor, and first and second current-conducting terminals refer to drain and source terminals (or vice versa) of a transistor. Although the below description may use terminology commonly used in conjunction with FET devices, the various embodiments are not limited to implementations the utilize FET devices, and instead are meant to apply also to implementations that utilize BJT devices or other types of transistors.

The terms "integrated circuit die" and "IC die" mean a single, distinct die within which one or more circuit components (e.g., transistors, passive devices, and so on) are integrated and/or directly physically connected. The term "silicon ... IC die" (e.g., as in a "silicon driver stage IC die") means an integrated circuit die that includes a silicon power transistor. For example, a "silicon ... IC die" is a die that includes a silicon power transistor (e.g., a FET, MOSFET, LDMOS FET, or other type of silicon transistor) formed in and/or on a silicon substrate, a silicon-on-insulator substrate, or another suitable silicon-based substrate. A "silicon power transistor" or "silicon transistor" means a transistor in which the primary current-conducting channel is formed primarily from silicon semiconductor materials. The term "GaN ... IC die" (e.g., as in a "GaN final stage IC die") mean an integrated circuit die that includes a GaN power transistor. For example, a "GaN IC die" is a die that includes a GaN power transistor formed in and/or on a GaN substrate, a GaN-on-silicon substrate, a GaN-on-silicon carbide (SiC) substrate, a GaN on aluminum nitride (AlN) substrate, a GaN on sapphire substrate, a GaN on diamond substrate, or another suitable GaN-based hetero-epitaxy and substrate arrangement. A "GaN power transistor" or "GaN transistor" means a transistor in which the primary current-conducting channel is formed primarily from GaN semiconductor materials.

FIG. 1 is a simplified block diagram of a two-stage amplifier 100 with a silicon driver stage IC die 110 and a GaN final stage IC die 180 electrically coupled together in a cascade arrangement between an RF signal input terminal 102 and an RF signal output terminal 104, in accordance with an example embodiment. The silicon driver stage IC die 110 includes a silicon IC die input terminal 120, a silicon IC die output terminal 122, an input impedance matching circuit 130, a silicon transistor 140, an integrated portion of an interstage impedance matching circuit 150, a bias voltage control circuit 160 ("final stage bias circuit"), and a harmonic control circuit 170 ("final stage harmonic control circuit"), in an embodiment. The final stage bias circuit 160 and the final stage harmonic control circuit 170 may be referred to herein as "secondary circuits" of the silicon driver stage IC die 110, in that they are integrated with the silicon driver stage IC die 110, but their functionality is associated with affecting the bias voltage or the harmonic control for the GaN transistor 182, respectively, as will be described in more detail later. As the silicon driver stage IC die 110 includes an active device (i.e., the silicon transistor 140) and a plurality of integrated passive components associated with the input and interstage impedance matching circuits 130, 150, the silicon drive stage IC die 110 may alternatively be considered an "Integrated Active Device" (IAD).

Along a forward amplification path, the RF signal input terminal 102 is electrically coupled to the silicon IC die input terminal 120 through connection 103 (e.g., a wirebond, wirebond array, or other electrical connection), the silicon IC die input terminal 120 is coupled to an input to the input impedance matching circuit 130, an output of the input impedance matching circuit 130 is coupled to an input 144 (control terminal) of the silicon transistor 140, an output 146 (current-conducting terminal) of the silicon transistor 140 is coupled to an input to the interstage impedance matching circuit 150, and an output of the interstate impedance matching circuit 150 is coupled to the silicon IC die output terminal 122.

The silicon IC die output terminal 122 is electrically coupled through a connection 174 (e.g., a wirebond array or other DC-coupled conductive connection) to a GaN IC die input terminal 190 of the GaN final stage IC die 180. The connection 174 represents a non-integrated portion of the interstage matching circuit between the output (e.g., drain) of the silicon transistor 140 and the input (e.g., gate) of the GaN transistor 182. More specifically, the connection 174 is positioned at a low input impedance point in the circuit to match the silicon transistor 140 to the GaN transistor 182 final impedance, which has a low gate-source capacitance, Cgs. In one embodiment, connection 174 is an inductive connection, such as a wirebond array. In other embodiments, other types of DC-coupled connections may be implemented. For example, in an alternate embodiment, dies 110, 180 may be flip-chip dies, or may be configured or packaged so that DC bias and RF signals are conveyable through a substrate to which the dies 110, 180 are coupled, rather than being conveyed through wirebonds or other electrical connections that are distinct from the substrate.

The GaN final stage IC die 180 includes the GaN IC die input terminal 190, a GaN IC die output terminal 192, and a GaN transistor 182, in an embodiment. Continuing along the forward amplification path, the GaN IC die input terminal 190 is coupled to an input 184 (control terminal) of the GaN transistor 182, and an output 186 (current-conducting terminal) of the GaN transistor 182 is coupled to the GaN IC die output terminal 192. The GaN IC die output terminal 192 is electrically coupled through connection 179 (e.g., a wirebond array or other electrical connection) to the RF signal output terminal 104.

During operation, an RF signal received through the RF signal input terminal 102 and the silicon IC die input terminal 120 is conveyed through the input impedance matching circuit 130, which is configured to raise the impedance of amplifier 100 to a higher impedance level (e.g., 50 Ohms or another impedance level) to enhance gain flatness and power transfer across the frequency band. The resulting RF signal is then amplified by the silicon transistor 140 (i.e., the silicon transistor 140 functions as a driver amplifier, which applies a first gain to the RF signal, or "pre-amplifies" the RF signal). For example, the silicon transistor 140 may apply a gain in a range of about 10 decibels (dB) to about 25 dB to the RF signal (e.g., about 20 dB, in some embodiments), although the gain applied by the silicon transistor 140 may be lower or higher, as well. The amplified RF signal produced at the output 146 of the silicon transistor 140 is then conveyed through the integrated portion of the interstage impedance matching circuit 150. The resulting RF signal produced at output terminal 122 is then conveyed through the connection 174 to the GaN IC die input terminal 190 of the GaN final stage IC die 180. The integrated portion of the interstage impedance matching circuit 150 and the connection 174 between the die 110, 180 together are configured to match the output impedance (or drain impedance) of silicon transistor 140 with the input impedance of GaN transistor 182 to enhance gain flatness and power transfer across the frequency band. In some embodiments, the connection 174 is a non-integrated, series inductive component in the interstage matching circuit between the output of the silicon amplifier 140 and the input 184 of the GaN amplifier 182.

The pre-amplified RF signal received at the GaN IC die input terminal 190 is amplified by the GaN transistor 182 (i.e., the GaN transistor 182 functions as a final amplifier, which applies a second gain to the RF signal). For example, the GaN transistor 182 may apply a gain in a range of about 10 dB to about 15 dB to the RF signal (e.g., about 14 dB, in some embodiments), yielding a total gain through the device 100 in a range of about 20 dB to about 40 dB (e.g., about 35 dB, in some embodiments), although the gain applied by the GaN transistor 182 and/or the total device gain may be lower or higher, as well. The amplified RF signal produced at the output 186 of the GaN transistor 182 is then conveyed through the GaN IC die output terminal 192 and the connection 179 to the RF signal output terminal 104.

According to an embodiment, the silicon driver stage IC die 110 further includes an integrated bias voltage control circuit 160 (or "final stage gate bias circuit"), which is configured to convey a bias voltage to the input 184 (e.g., the gate terminal) of the GaN transistor 182 of the GaN final stage IC die 180. More specifically, the silicon driver stage IC die 110 includes a bias voltage control circuit input terminal 158 (referred to simply as "bias input terminal"), and the integrated bias voltage control circuit 160 electrically coupled between the bias input terminal 158 and the output terminal 122. The integrated bias voltage control circuit 160 is a DC-DC converter circuit, in an embodiment. In various embodiments, the integrated bias voltage control circuit 160 may be configured to: 1) convert a positive DC bias voltage into another positive DC bias voltage at a different voltage level; 2) convert a positive DC bias voltage into a negative DC bias voltage; 3) convert a negative DC bias voltage into a positive DC bias voltage; or 4) convert a negative DC bias voltage into another negative DC bias voltage at a different voltage level. The bias input terminal 158 is configured to receive a bias voltage from external bias circuit (e.g., an external voltage source 164, which produces a DC bias voltage, +$V_{DD}$ or -$V_{DD}$) through the bias input terminal 158, and the integrated bias voltage control circuit 160 performs a DC-DC conversion of the received bias voltage to produce a final stage gate bias voltage, which is provided to the GaN transistor 182 of the GaN final stage IC die 180. Because the bias input terminal 158 is electrically coupled to a "secondary circuit" of the silicon driver stage IC die 110 (or more specifically the integrated bias voltage control circuit 160), input terminal 158 alternatively may be referred to as a "secondary circuit terminal."

According to an embodiment, the GaN transistor 182 is a depletion-mode, normally-on device, and the received and conveyed bias voltage is a negative DC bias voltage that functions to pinch off the GaN transistor 182. In another embodiment, the GaN transistor 182 is an enhancement-mode, normally-off device, and the received and conveyed bias voltage is a positive DC bias voltage. As previously stated, the output terminal 122 is electrically coupled through connection 174 (e.g., one or more wirebonds or other conductive connections) to the input terminal 190 of the GaN final stage IC die 180. The integrated bias voltage control circuit 160 and the connection 174 together are configured to filter the DC bias voltage, and to produce the resulting bias voltage signal at the input terminal 190. The input terminal 190, in turn, is electrically coupled to the input 184 (e.g., the gate terminal) of the GaN transistor 182. During operation, a bias voltage received from the external bias voltage source 164 by the integrated bias voltage control circuit 160 through the bias input terminal 158 is conditioned (e.g., filtered) by circuit 160 and conveyed to the input 184 of the GaN transistor 182 through the output terminal 122 of the silicon driver stage IC die 110, connection 174, and the input terminal 190 of the GaN final stage IC die 180.

As indicated in the above description, the final stage gate bias voltage and the pre-amplified RF signal produced by the silicon transistor 140 both are conveyed through the same output terminal 122, connection 174, and input terminal 190. Further, as will be described in more detail in conjunction with FIG. 2, the final stage gate bias circuit 160 and the integrated portion of the interstage impedance matching circuit 150 may share some electrical components (e.g., resistor 254 and inductor 255, FIG. 2). In alternate embodiments, the final stage gate bias circuit 160 may not share any components with the integrated portion of the interstage impedance matching circuit 150, but instead may include components that are not a portion of the interstage impedance matching circuit 150. In addition, in other embodiments, the final stage gate bias voltage and the pre-amplified RF signal produced by the silicon transistor 140 may be conveyed between the dies 110, 180 through different conductive paths. In other words, whereas the pre-amplified RF signal may be conveyed through the output terminal 122, connection 174, and input terminal 190, the final stage gate bias voltage may be conveyed through a separate output terminal of the silicon driver stage IC die 110, a separate DC-coupled connection (e.g., wirebonds or other electrical connections), and a separate input terminal of the GaN final stage IC die 180.

According to another embodiment, the silicon driver stage IC die 110 further includes an integrated harmonic control circuit 170 (or "final stage harmonic control circuit") configured to provide a low-impedance path to an external ground reference 128 for signals at one or more harmonic frequencies (e.g., a second harmonic frequency ($2f_0$), a third harmonic frequency ($3f_0$), and so on) of the fundamental frequency ($f_0$) at which the amplifier 100 is configured to operate. More specifically, the silicon driver stage IC die 110 includes a harmonic control circuit input terminal 171 and the integrated harmonic control circuit 170 electrically coupled between the harmonic control circuit input terminal 171 and the external ground reference 128. The harmonic control circuit input terminal 171 is electrically coupled through connection 178 (e.g., one or more wirebonds or other conductive connections) to a harmonic signal output terminal 194 of the GaN final stage IC die 180. The harmonic signal output terminal 194, in turn, is electrically coupled to the input terminal 184 (e.g., the gate terminal) of the GaN transistor 182. During operation, signal energy produced at the input terminal 184 of the GaN transistor 182 at one or more harmonic frequencies is conveyed from the harmonic signal output terminal 194 through connection 178 to the harmonic control circuit input terminal 171, and the final stage harmonic control circuit 170 functions to shunt the harmonic frequency signal energy to the external ground reference 128. Because the harmonic control circuit input terminal 171 is electrically coupled to a "secondary circuit" of the silicon driver stage IC die 110 (or more specifically the harmonic control circuit 170), input terminal 171 alternatively may be referred to as a "secondary circuit terminal."

The device 100 of FIG. 1 may have several advantages over conventional devices. Conceptually, the silicon driver stage IC die 110 functions to buffer the input to the GaN final stage IC die 180. More specifically, utilization of the silicon driver stage IC die 110 isolates the dynamic input of the GaN final stage IC die 180, which may make the device 100 better suited for broadband applications. In addition, the interaction between the silicon driver stage IC die 110 and the GaN final stage IC die 180 may enable better shaping of the AM/PM and AM/AM responses. Further, the silicon driver stage IC die 110 may provide proper input harmonic loading for GaN wave shaping. Further still, various embodiments of silicon driver stage IC dies 110 may be offered as standard options that can be flexibly mated with a variety of high-performing GaN final stage IC dies 180, thus enabling more rapid introduction of two-stage devices into the market.

Circuit diagrams that include depictions of more specific embodiments of amplifier 100 will now be described in more detail in conjunction with FIGS. 2 and 3. More specifically, FIG. 2 is a circuit diagram of an embodiment of a two-stage, cascade amplifier, and FIG. 3 is a circuit diagram of an embodiment of a two-stage, cascade amplifier in which the silicon driver stage IC die 110 specifically includes a cascode stack power amplifier.

Figure 2:
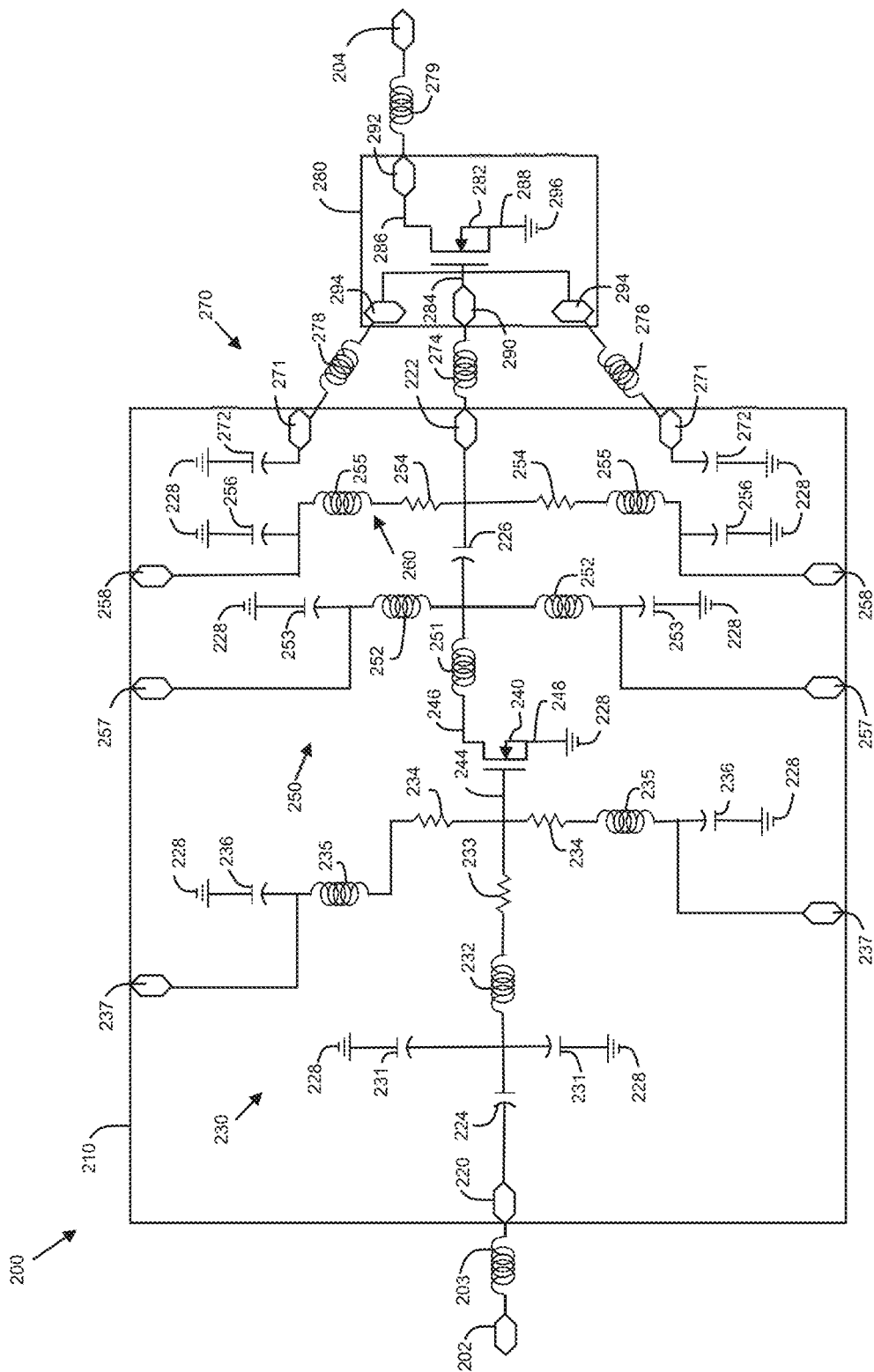
FIG. 2 is a circuit diagram of a two-stage, cascade amplifier with a silicon driver stage and a GaN final stage, in accordance with an example embodiment.
Figure 3:
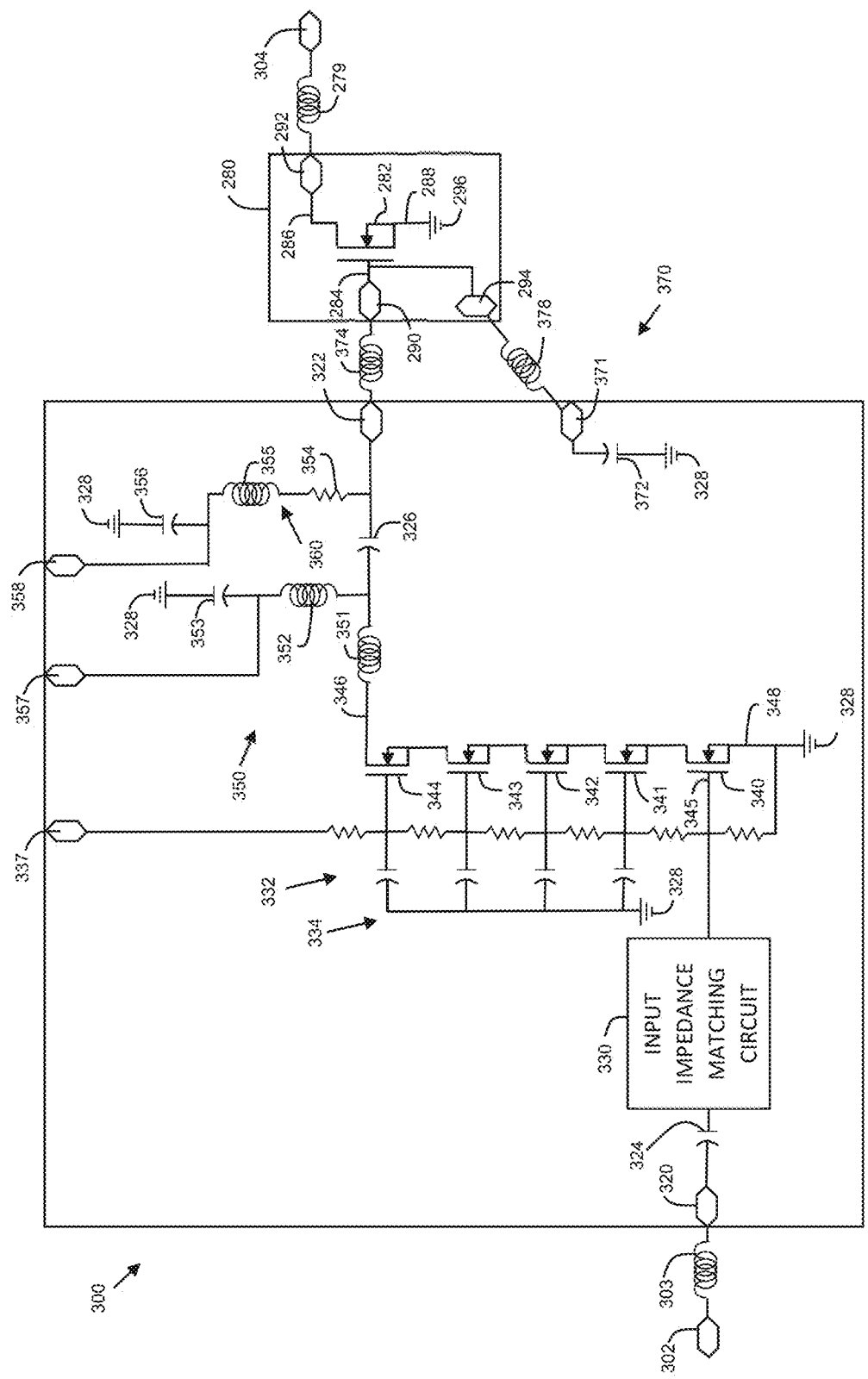
FIG. 3 is a circuit diagram of a two-stage, cascade amplifier with a silicon cascode driver stage and a GaN final stage, in accordance with an example embodiment.

Turning first to FIG. 2, a circuit diagram is illustrated of a two-stage, cascade amplifier 200 with a silicon driver stage and a GaN final stage, in accordance with an example embodiment. Amplifier 200 includes a silicon driver stage IC die 210 (e.g., silicon IC die 110, FIG. 1) and a GaN final stage IC die 280 (e.g., GaN IC die 180, FIG. 1), which are electrically coupled together in a cascade arrangement between an RF signal input terminal 202 (e.g., input terminal 102, FIG. 1) and an RF signal output terminal 204 (e.g., output terminal 104, FIG. 1). A plurality of circuits, each including an arrangement of passive and/or active electrical components, are integrated within the silicon driver stage IC die 210 and the GaN final stage IC die 280.

More specifically, the silicon driver stage IC die 210 includes a plurality of circuits integrated within a silicon IC die. In an embodiment, the integrated circuitry of die 210 includes an input terminal 220 (e.g., input terminal 120, FIG. 1), an output terminal 222 (e.g., output terminal 122, FIG. 1), a first DC blocking/AC decoupling capacitor 224, a second DC blocking/AC decoupling capacitor 226, an input impedance matching circuit 230 (e.g., circuit 130, FIG. 1), a power transistor 240 (e.g., transistor 140, FIG. 1), an integrated portion of an interstage impedance matching circuit 250 (e.g., circuit 150, FIG. 1), a bias voltage control circuit 260 (e.g., circuit 160, FIG. 1), and an integrated portion of a harmonic control circuit 270 (e.g., circuit 170, FIG. 1), in an embodiment.

The power transistor 240 is the primary amplification component of the silicon driver stage IC die 210. In an embodiment, power transistor 240 includes a FET with a gate terminal 244 (control terminal), a drain terminal 246 (first current-conducting terminal), and a source terminal 248 (second current conducting terminal). The source terminal 248 is electrically coupled to a ground node 228 (e.g., the source terminal 248 is electrically coupled to a conductive layer on a bottom surface of the silicon IC die 210 through one or more through substrate vias (TSVs)).

The RF signal input terminal 202 is electrically coupled to the input terminal 220 of the silicon driver stage IC die 210 with an connection 203 (e.g., a plurality of wirebonds or another electrical connection). The first DC blocking/AC decoupling capacitor 224 has a first terminal electrically coupled to the input terminal 220, and a second terminal electrically coupled to the input impedance matching circuit 230. The first DC blocking/AC decoupling capacitor 224 may provide some impedance transformation, but with a primary functionality of blocking the driver stage gate bias voltage, Vg1 (e.g., up to about 3.2 volts or more) from the input terminal 220.

Figure 4:
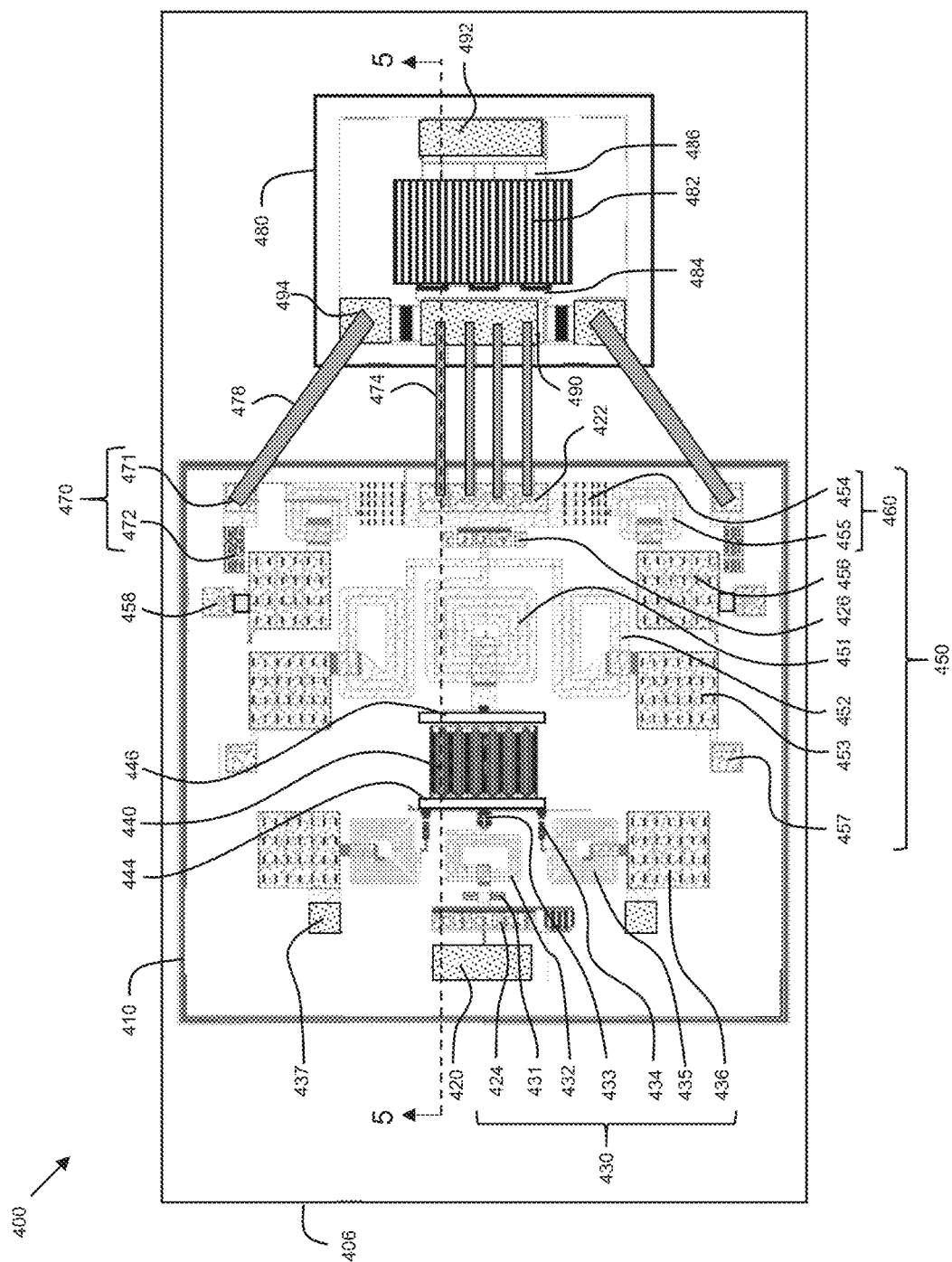
FIG. 4 is a top view of a portion of an amplifier with a silicon driver stage integrated circuit (IC) die electrically coupled to a GaN final stage IC die, in accordance with an example embodiment.

The input impedance matching circuit 230 is electrically coupled between the second terminal of the DC blocking/AC decoupling capacitor 224 and the gate terminal 244 of the power transistor 240. In FIG. 2, the input impedance matching circuit 230 is depicted as having parallel, symmetrical sub-circuits, which represent an actual example layout of the silicon driver stage IC die 210 (e.g., an example layout as depicted in FIG. 4). In other embodiments, the corresponding parallel sub-circuits may be combined together into a single sub-circuit, with component values that have substantially equivalent electrical characteristics as the parallel sub-circuit embodiments. In FIG. 2, corresponding components of the parallel sub-circuits have identical reference numbers.

The input impedance matching circuit 230 includes the first DC blocking/AC decoupling capacitor 224, a second capacitor 231, a first inductor 232, a first resistor 233, and a shunt circuit that includes a series combination of a second resistor 234, a second inductor 235, and a third capacitor 236. The second capacitor 231 includes a first terminal coupled to the second terminal of the DC blocking/AC decoupling capacitor 224, and a second terminal coupled to the ground node 228. The first inductor 232 includes a first terminal coupled to the second terminal of the DC blocking/AC decoupling capacitor 224 (and to the first terminal of capacitor 231), and a second terminal coupled to the gate terminal 244 of the power transistor 240 through the first resistor 233. The shunt circuit includes the second resistor 234, the second inductor 235, and the third capacitor 236 (e.g., a DC blocking capacitor) electrically coupled between the gate terminal 244 of the power transistor 240 and the ground node 228. In alternate embodiments, the order of the second resistor 234, the second inductor 235, and the third capacitor 236 may be different from the order depicted in FIG. 2.

The input impedance matching circuit 230 functions to raise the impedance of amplifier 100, as previously mentioned, and also to impart amplitude and phase distortions on the RF signal that are inverse to the amplitude and phase distortions imparted by the GaN transistor 182 of the GaN final stage IC die 180. As will be explained in more detail below, the input impedance matching circuit 230 (by itself or in conjunction with the interstage impedance matching circuit 250) may be characterized by a positive loss slope that complements the negative gain slopes of transistors 140, 182 to create a flat RF gain response. The input impedance matching circuit 230 may include a low pass circuit, a high pass circuit, a bandpass circuit, or a combination thereof, in various embodiments. In various embodiments:

the DC blocking/AC decoupling capacitor 224 may have a capacitance value in a range of about 4.1 picofarads (pF) to about 5.1 pF (e.g., about 4.6 pF for a center operating frequency, $f_0$, of about 3.5 gigahertz (GHz));

the second capacitor 231 may have a capacitance value in a range of about 0.2 pF to about 0.3 pF (e.g., about 0.25 pF for a center operating frequency, $f_0$, of about 3.5 GHz);

the first inductor 232 may have an inductance value in a range of about 2.0 nanohenries (nH) to about 3.0 nH (e.g., about 2.54 nH for a center operating frequency, $f_0$, of about 3.5 GHz);

the first resistor 233 may have a negligible resistance value;

the second resistor 234 may have a negligible resistance value;

the second inductor 235 may have an inductance value in a range of about 3.3 nH to about 4.3 nH (e.g., about 3.85 nH for a center operating frequency, $f_0$, of about 3.5 GHz); and the third capacitor 236 may have a capacitance value in a range of about 15 pF to about 25 pF (e.g., about 20 pF for a center operating frequency, $f_0$, of about 3.5 GHz).

The inductance, capacitance, and resistance values may be lower or higher than the above given ranges, in various embodiments. Generally, the inductance, capacitance, and resistance values will be scaled according to the center frequency of operation of the amplifier 200. Further, although the input impedance matching circuit 230 is shown in FIG. 2 to have a particular configuration, in other embodiments, the input impedance matching circuit 230 may be differently configured, while still performing substantially the same functions.

A gate bias voltage, Vg1, for the power transistor 240 is provided to the gate terminal 244 of the power transistor 240 through the shunt circuit of the input impedance matching circuit 230, in an embodiment. More particularly, the gate bias voltage may be provided through an input terminal 237, which is electrically coupled to a node of the shunt circuit (e.g., a node between the second inductor 235 and the third capacitor 236). For example, the gate bias voltage may be provided by an external voltage source, and may have a value up to about 3.2 volts or more, although the gate bias voltage may be lower or higher, as well.

The integrated portion of the interstage impedance matching circuit 250 is electrically coupled between the drain terminal 246 of the power transistor 240, and the output terminal 222. Again in FIG. 2, the integrated portion of the interstage impedance matching circuit 250 is depicted as having parallel, symmetrical sub-circuits, which represent an actual example layout of the silicon driver stage IC die 210 (e.g., an example layout as depicted in FIG. 4). In other embodiments, the corresponding parallel sub-circuits may be combined together into a single sub-circuit, with component values that have substantially equivalent electrical characteristics as the parallel sub-circuit embodiments.

The integrated portion of the interstage impedance matching circuit 250 includes a first inductor 251, a first shunt circuit, the second DC blocking/AC decoupling capacitor 226, and a second shunt circuit. The first inductor 251 includes a first terminal coupled to the drain terminal 246 of the power transistor 240, and a second terminal coupled to a first terminal of the second DC blocking/AC decoupling capacitor 226. The first shunt circuit includes a series combination of a second inductor 252 and a first capacitor 253 (e.g., a DC blocking capacitor) electrically coupled between the second terminal of the first inductor 251 (and the first terminal of the second DC blocking/AC decoupling capacitor 226) and the ground node 228. The second shunt circuit includes a series combination of a first resistor 254, a third inductor 255, and a second capacitor 256 (e.g., a DC blocking capacitor) electrically coupled between the output terminal 222 (and the second terminal of the second DC blocking/AC decoupling capacitor 226) and the ground node 228. In alternate embodiments, the order of the resistor 254, the inductor 255, and the capacitor 256 may be different from the order depicted in FIG. 2.

The interstage impedance matching circuit 250, coupled with connection 274, function to match the impedance of the drain terminal 246 of power transistor 240 to the gate terminal 284 of transistor 282 for proper power transfer across the frequency band. In addition, the interstage impedance matching circuit 250 functions to shape the input RF waveforms to the GaN final stage IC die 280. As indicated above, the interstage impedance matching circuit 240 (by itself or in conjunction with the input impedance matching circuit 230) may be characterized by a positive loss slope that complements the negative gain slopes of transistors 140, 182 to create a flat RF gain response. For example, when the transistors 140, 182 are characterized by a roll off of X dB per octave (e.g., 6 dB per octave or some other value), the input and/or interstage impedance matching circuits 230, 250 may be designed to have a positive slope of X dB per octave (e.g., 6 dB per octave or some other value). This produces a complimentary gain response and may present an overall flatter gain.

The interstage impedance matching circuit 250 (plus connection 274) may include a low pass circuit, a high pass circuit, a bandpass circuit, or a combination thereof, in various embodiments. In various embodiments:

- the first inductor 251 may have an inductance value in a range of about 3 nH to about 5 nH (e.g., about 4 nH for a center operating frequency, $f_0$, of about 3.5 GHz);
- the second inductor 252 may have an inductance value in a range of about 1.3 nH to about 2.3 nH (e.g., about 1.86 nH for a center operating frequency, $f_0$, of about 3.5 GHz);
- the first capacitor 253 may have a capacitance value in a range of about 15 pF to about 25 pF (e.g., about 20 pF for a center operating frequency, $f_0$, of about 3.5 GHz);
- the DC blocking/AC decoupling capacitor 226 may have a capacitance value in a range of about 3.4 pF to about 4.4 pF (e.g., about 3.9 pF for a center operating frequency, $f_0$, of about 3.5 GHz);
- the first resistor 254 may have a resistance value in a range of about 4.7 ohms to about 5.7 ohms (e.g., about 5.2 ohms for a center operating frequency, $f_0$, of about 3.5 GHz);
- the third inductor 255 may have an inductance value in a range of about 0.3 nH to about 1.3 nH (e.g., about 0.81 nH for a center operating frequency, $f_0$, of about 3.5 GHz);
- and the second capacitor 256 may have a capacitance value in a range of about 15 pF to about 25 pF (e.g., about 20 pF for a center operating frequency, $f_0$, of about 3.5 GHz).

The inductance, capacitance, and resistance values may be lower or higher, in various embodiments. Generally, the inductance, capacitance, and resistance values will be scaled according to the center frequency of operation of the amplifier 200. Further, although the interstage impedance matching circuit 250 is shown in FIG. 2 to have a particular configuration, in other embodiments, the interstage impedance matching circuit 250 may be differently configured, while still performing substantially the same functions.

The second DC blocking/AC decoupling capacitor 226 may provide some impedance transformation, but with a primary functionality of blocking a drain bias voltage, Vd1 from a gate bias voltage, Vg2, for the power transistor 282 of the GaN final stage IC die 280. The drain bias voltage, Vd1, for the power transistor 240 is provided to the drain terminal 246 of the power transistor 244 through the first shunt circuit of the interstage impedance matching circuit 250, in an embodiment. More particularly, the drain bias voltage may be provided through an input terminal 257, which is electrically coupled to a node of the shunt circuit (e.g., a node between the second inductor 252 and the first capacitor 253). For example, the drain bias voltage may be provided by an external voltage source, and may have a value in a range of about 28 volts to about 48 volts, although the drain bias voltage may be lower or higher, as well. Thus, at least a portion of the first shunt circuit functions as a driver stage bias control circuit, or more specifically as a driver stage drain bias voltage control circuit.

According to an embodiment, the gate bias voltage, Vg2, for the power transistor 282 of the GaN final stage IC die 280 is provided through a portion of the second shunt circuit of the interstage impedance matching circuit 250. More specifically, an integrated gate bias voltage circuit 260 (or "final stage bias circuit") includes an input terminal 258, inductor 255, and resistor 254, in an embodiment. During operation, a DC voltage may be provided through the input terminal 258 (e.g., by an external voltage source, such as source 164, FIG. 1), which is electrically coupled to a node of the shunt circuit (e.g., a node between inductor 255 and capacitor 256). The integrated gate bias voltage circuit 260 then converts the received voltage into a DC gate bias voltage, Vg2, for the GaN transistor 282. For example, the gate bias voltage may have a value of about −5 volts, although the gate bias voltage may be lower or higher and/or positive, as well.

Notably, the gate bias voltage control circuit 260 (or "final stage bias circuit") for the gate bias voltage, Vg2, for the power transistor 282 of the GaN final stage IC die 280 is integrated into the silicon driver stage IC die 210. By including the gate bias voltage control circuit 260 in the silicon driver stage IC die 210, rather than in the GaN final stage IC die 280, may yield significant cost savings due to the significantly lower cost of silicon die area versus GaN die area. In addition, the discrete components (e.g., MIM capacitors) implemented in silicon may have better control than similar components implemented in GaN.

The drain bias voltage, Vd2, for the GaN power transistor 282 may be provided to the drain terminal 286 of the power transistor 282 through RF output terminal 292, in an embodiment. For example, the drain bias voltage may be provided by an external voltage source, and may have a value in a range of about 28 volts to about 48 volts, although the drain bias voltage may be lower or higher, as well. In some embodiments, the drain bias voltages for transistors 240, 282 may be unequal (e.g., Vd1=28 volts and Vd2=48 volts), whereas in other embodiments, the drain bias voltages for transistors 240, 282 may be equal (e.g., Vd1=Vd2=28 volts, or Vd1=Vd2=48 volts).

As indicated above, the silicon driver stage IC die 210 also may include an integrated portion of a harmonic control circuit 270 (or "final stage harmonic control circuit"), which is electrically coupled to the gate terminal 284 of the power transistor 282 of the GaN final stage IC die 280. More specifically, an integrated portion of a harmonic control circuit 270 includes an input terminal 271, and a capacitor 272, which is electrically coupled between the input terminal 271 and the ground node 228, in an embodiment. The input terminal 271 is electrically coupled, via connection 278, to terminal 294 of the GaN final stage IC die 280. Terminal 294, in turn, is electrically coupled to the gate terminal 284 of the power transistor 282 of the GaN final stage IC die 280. In some embodiments, connection 278 is an inductive connection (e.g., a wirebond, wirebond array, or other inductive connection), and together, the serial combination of the connection 278 and the capacitor 272 provide a low impedance path to the ground node 228 for signal energy at the second harmonic, $2f_O$, of the center operating frequency, $f_O$, of the amplifier 200. According to an embodiment, the capacitor 272 has a capacitance value of about 0.4 pF to about 0.8 pF (e.g., about 0.6 pF for a center operating frequency, $f_O$, of about 3.5 GHz), and the connection 278 has an inductance value of about 0.5 nH to about 1.1 nH (e.g., about 0.8 nH for a center operating frequency, $f_O$, of about 3.5 GHz), although the inductance value may be smaller or larger, as well. Again, including a portion of the harmonic control circuit 270 in the silicon driver stage IC die 210, rather than in the GaN final stage IC die 280, may yield significant cost savings due to the significantly lower cost of silicon die area versus GaN die area.

As stated above, the silicon driver stage IC die 210 (e.g., silicon IC die 110, FIG. 1) is electrically coupled to the GaN final stage IC die 280 (e.g., GaN IC die 180, FIG. 1). In an embodiment, the silicon IC die 210 is electrically coupled to the GaN IC die 280 through connection 274 between the output terminal 222 of the silicon IC die 210 and an input terminal 290 of the GaN IC die 280. For example, the connection 274 may include an inductive connection, such as a wirebond array (e.g., wirebond array 474, FIG. 4), or may include another type of DC-coupled connection (e.g., including a microstrip line, a printed coil, a parallel-coupled resistor/capacitor circuit, and so on). The connection 274 may have a dual function. The first function is to convey the gate bias voltage, Vg2, for the power transistor 282 of the GaN final stage IC die 280 from the gate bias voltage control circuit 260 to the gate terminal 284 of the power transistor 282. The second function is to provide a non-integrated portion of the interstage impedance matching circuit 250. According to an embodiment, the connection 274 has an inductance value in a range of about 0.2 nH to about 0.3 nH (e.g., about 0.25 nH), although the inductance value may be smaller or larger, as well.

The GaN final stage IC die 280 includes a plurality of circuits integrated within a GaN IC die. In an embodiment, the integrated circuitry of die 280 includes an input terminal 290 (e.g., input terminal 190, FIG. 1), an output terminal 292 (e.g., output terminal 192, FIG. 1), and a power transistor 282 (e.g., transistor 182, FIG. 1), in an embodiment.

The power transistor 282 is the primary amplification component of the GaN final stage IC die 280. In an embodiment, power transistor 282 includes a FET with a gate terminal 284 (control terminal), a drain terminal 286 (first current-conducting terminal), and a source terminal 288 (second current conducting terminal). The input terminal 290 is coupled to the gate terminal 284 of the GaN transistor 282. The drain terminal 286 of the GaN transistor 282 is coupled to the output terminal 292, and the source terminal 288 of the GaN transistor 282 is electrically coupled to a ground node 296 (e.g., the source terminal 288 is electrically coupled to a conductive layer on a bottom surface of the GaN IC die 280 through one or more TSVs). The output terminal 292 is electrically coupled through a connection 279 (e.g., a wirebond array or other electrical connection) to the RF signal output terminal 204 of the amplifier 200.

An alternate embodiment of a multiple-stage amplifier is depicted in FIG. 3, which is a circuit diagram of a two-stage, cascade amplifier 300 with a silicon cascode stack driver stage and a GaN final stage, in accordance with an example embodiment. More specifically, amplifier 300 includes a silicon driver stage IC die 310 (e.g., silicon IC die 110, FIG. 1) and a GaN final stage IC die 280 (e.g., GaN IC die 180, FIG. 1) electrically coupled together in a cascade arrangement. A plurality of circuits, each including an arrangement of passive and/or active electrical components, are integrated within the silicon driver stage IC die 310 and the GaN final stage IC die 280.

In the embodiment of FIG. 3, a number of the integrated circuit components may be similar or identical to corresponding components of the embodiment of FIG. 2. For example, in FIG. 3, the GaN final stage IC die 280 of FIG. 3 may be substantially similar to the GaN final stage IC die 280 of FIG. 2. In addition, in the silicon driver stage IC die 310, the input and interstage impedance matching circuits 330, 350 may be substantially similar to the input and interstage impedance matching circuits 230, 250 of the amplifier 200 of FIG. 2. For purpose of brevity, many of the components and circuits of FIG. 3 that have similar counterparts in the embodiment of FIG. 2 are not discussed in detail below. The details of corresponding components discussed above in conjunction with FIG. 2 are intended to apply also to the corresponding components discussed below in conjunction with FIG. 3. It should be noted that corresponding components between FIGS. 2 and 3 either have identical reference numbers, or have the same last two numerical digits (e.g., components 220 and 320 are corresponding components).

Referring now to FIG. 3, the silicon driver stage IC die 310 includes a plurality of circuits integrated within a silicon IC die. In an embodiment, the integrated circuitry of die 310 includes an input terminal 320 (e.g., input terminal 120, FIG. 1), an output terminal 322 (e.g., output terminal 122, FIG. 1), a first DC block/AC decoupling capacitor 324, a second DC block/AC decoupling capacitor 326, an input impedance matching circuit 330 (e.g., circuit 130, FIG. 1), a plurality of power transistors 340, 341, 342, 343, 344 coupled together in a cascode stack arrangement, an integrated portion of an interstage impedance matching circuit 350 (e.g., circuit 150, FIG. 1), a bias voltage control circuit 360 (e.g., circuit 160, FIG. 1), and an integrated portion of a harmonic control circuit 370 (e.g., circuit 170, FIG. 1), in an embodiment.

The RF signal input terminal 302 is electrically coupled to the input terminal 320 of the silicon driver stage IC die 310 with a connection 303 (e.g., a plurality of wirebonds or another electrical connection). The first DC block/AC decoupling capacitor 324 has a first terminal electrically coupled to the input terminal 320, and a second terminal electrically coupled to the input impedance matching circuit 330. The first DC block/AC decoupling capacitor 324 may provide some impedance transformation, but with a primary functionality of blocking the gate bias voltage, Vg1, from the input terminal 320.

The input impedance matching circuit 330 is electrically coupled between the second terminal of the DC block/AC decoupling capacitor 324 and the gate terminal 345 of the power transistor 340. In FIG. 3, the input impedance matching circuit 330 is depicted as a block. In various embodiments, the input impedance matching circuit 330 may have a structure that is similar or identical to the structure of the embodiments of input impedance matching circuit 230 (FIG. 2), which was described in detail above. For purpose of brevity, the details of input impedance matching circuit 330 are not depicted in FIG. 3 or described in detail. The details of input impedance matching circuit 230 discussed above in conjunction with FIG. 2 are intended to apply also to the input impedance matching circuit 330 of FIG. 3.

The cascode stack of power transistors 340-344 is the primary amplification component of the silicon driver stage IC die 310. Although a cascode stack consisting of five transistors is illustrated in FIG. 3, other embodiments may include fewer or more transistors connected in a cascode stack arrangement (e.g., from 2 to 10 transistors or more). Further, other embodiments may include different cascode topologies from the topology depicted in FIG. 3.

In an embodiment, each of the power transistors 340-344 includes a CMOS FET with a gate terminal (e.g., gate terminal 345), a drain terminal (e.g., drain terminal 346), and a source terminal (e.g., source terminal 348). The gate terminal 345 of the lowest transistor 340 in the stack is electrically coupled to the input impedance matching circuit 330. The source terminal 348 of the lowest transistor 340 in the stack is electrically coupled to a ground node 328 (e.g., the source terminal 348 is electrically coupled to a conductive layer on a bottom surface of the silicon IC die 310 through one or more TSVs). Proceeding from the lowest transistor 340 in the stack to the highest transistor 344 in the stack, the drain terminal of each lower transistor 340-343 is electrically coupled to the source terminal of each adjacent higher transistor 341-344, as illustrated in FIG. 3. The drain terminal 346 of the highest transistor 344 in the stack is electrically coupled to the output terminal 322, as described in more detail below. Essentially, the transistors 340-344 of the silicon driver stage IC die 310 are connected together as a CMOS cascode stack, in an embodiment. In some embodiments, the silicon driver stage IC die 310 is implemented using a silicon-on-insulator (SOI) substrate, although die 310 may be implemented using other types of substrates, in other embodiments.

Gate bias voltages, Vg1, for the power transistors 340-344 are provided to the gate terminals of the power transistors 340-344 through a voltage ladder network 332, in an embodiment. More particularly, a gate bias voltage may be provided through an input terminal 337, which is electrically coupled to the voltage ladder network 332. Through the voltage ladder network 332, consecutively higher gate bias voltages may be provided from the lowest transistor 340 up through the highest transistor 344. For example, the gate bias voltage may be provided to terminal 337 by an external voltage source, and may have a value in a range of about 3 volts to about 10 volts, although the gate bias voltage may be lower or higher, as well. According to an embodiment, AC components of the gate bias voltages may be bypassed to the ground node 328 through a capacitor network 334. In alternate embodiments, the capacitor network 334 may be excluded from the circuit.

The integrated portion of the interstage impedance matching circuit 350 is electrically coupled between the drain terminal 346 of the highest power transistor 344, and the output terminal 322. The integrated portion of the interstage impedance matching circuit 350 includes a first inductor 351, a first shunt circuit, the second DC block/AC decoupling capacitor 326, and a second shunt circuit. The first inductor 351 includes a first terminal coupled to the drain terminal 346 of the power transistor 344, and a second terminal coupled to a first terminal of the second DC block/AC decoupling capacitor 326. The first shunt circuit includes a series combination of a second inductor 352 and a first capacitor 353 electrically coupled between the second terminal of the first inductor 351 (and the first terminal of the second DC block/AC decoupling capacitor 326) and the ground node 328. The second shunt circuit includes a series combination of a first resistor 354, a third inductor 355, and a second capacitor 356 electrically coupled between the output terminal 322 (and the second terminal of the second DC block/AC decoupling capacitor 326) and the ground node 328. In alternate embodiments, the order of the resistor 354, the inductor 355, and the capacitor 356 may be different from the order depicted in FIG. 3.

The second DC block/AC decoupling capacitor 326 may provide some impedance transformation, but with a primary functionality of blocking a drain bias voltage, Vd1 from a gate bias voltage, Vg2, for the power transistor 282 of the GaN final stage IC die 280. The drain bias voltage, Vd1, for the power transistor 344 is provided to the drain terminal 346 of the power transistor 344 through the first shunt circuit of the interstage impedance matching circuit 350, in an embodiment. More particularly, the drain bias voltage may be provided through an input terminal 357, which is electrically coupled to a node of the shunt circuit (e.g., a node between the second inductor 352 and the first capacitor 353. For example, the drain bias voltage may be provided by an external voltage source, and may have a value of about 3 volts, although the drain bias voltage may be lower or higher, as well.

According to an embodiment, the gate bias voltage, Vg2, for the power transistor 282 of the GaN final stage IC die 280 is provided through a portion of the second shunt circuit of the interstage impedance matching circuit 350, in an embodiment. More specifically, an integrated gate bias voltage circuit 360 (or "final stage bias circuit") includes an input terminal 358, inductor 355, and resistor 354, in an embodiment. During operation, a DC voltage may be provided through the input terminal 358 (e.g., by an external voltage source, such as source 164, FIG. 1), which is electrically coupled to a node of the shunt circuit (e.g., a node between inductor 355 and capacitor 356). The integrated gate bias voltage circuit 360 then converts the received voltage into a DC gate bias voltage, Vg2, for the GaN transistor 282. For example, the gate bias voltage may have a value of about −5 volts, although the gate bias voltage may be lower or higher and/or positive, as well. Again, it should be noted that the gate bias voltage control circuit 360 for the gate bias voltage, Vg2, for the power transistor 282 of the GaN final stage IC die 280 is integrated into the silicon driver stage IC die 310, which may yield significant cost savings.

As indicated above, the silicon driver stage IC die 310 also may include an integrated portion of a harmonic control circuit 370 (or "final stage harmonic control circuit"), which is electrically coupled to the gate terminal 284 of the power transistor 282 of the GaN final stage IC die 210. More specifically, an integrated portion of a harmonic control circuit 370 includes an input terminal 371, and a capacitor 372, which is electrically coupled between the input terminal 371 and the ground node 328, in an embodiment. The input terminal 371 is electrically coupled, via connection 378, to terminal 294 of the GaN final stage IC die 280. Terminal 294, in turn, is electrically coupled to the gate terminal 284 of the power transistor 282 of the GaN final stage IC die 280. In some embodiments, connection 378 is an inductive connection (e.g., a wirebond, wirebond array, or other inductive connection), and together, the serial combination of the connection 378 and the capacitor 372 provide a low impedance path to the ground node 328 for signal energy at the second harmonic, $2f_O$, of the center operating frequency, $f_O$, of the amplifier 300. Again, including a portion of the harmonic control circuit 370 in the silicon driver stage IC die 310, rather than in the GaN final stage IC die 280, may yield significant cost savings.

As with the amplifier embodiment of FIG. 2, the silicon driver stage IC die 310 (e.g., silicon IC die 110, FIG. 1) is electrically coupled to the GaN final stage IC die 280 (e.g., GaN IC die 180, FIG. 1). In an embodiment, the silicon IC die 310 is electrically coupled to the GaN IC die 280 through connection 374 between the output terminal 322 of the silicon IC die 310 and an input terminal 290 of the GaN IC die 280. For example, the connection 374 may include an inductive connection such as a wirebond array (e.g., wirebond array 474, FIG. 4), or may include another type of DC-coupled connection (e.g., a microstrip line, distributed inductor, parallel-coupled resistor/capacitor circuit, and so on). As with the previously-described embodiment, the connection 374 may have a dual function. The first function is to convey the gate bias voltage, Vg2, for the power transistor 282 of the GaN final stage IC die 280 from the gate bias voltage control circuit 360 to the gate terminal 284 of the power transistor 282. The second function is to provide a non-integrated portion of the interstage impedance matching circuit 350. According to an embodiment, the connection 374 has an inductance value in a range of about 0.2 nH to about 0.3 nH (e.g., about 0.25 nH for a center operating frequency, $f_O$, of about 3.5 GHz), although the inductance value may be smaller or larger, as well.

The GaN final stage IC die 280 of FIG. 3 may be identical or substantially similar to the GaN final stage IC die 280 of FIG. 2. For purposes of brevity, the details of the GaN final stage IC die 280 of FIG. 3 are not repeated here. The details of the GaN final stage IC die 280 discussed above in conjunction with FIG. 2 are intended to apply also to the GaN final stage IC die 280 of FIG. 3.

Actual physical embodiments of multi-stage amplifier circuits and devices corresponding to the previously-described amplifiers will now be discussed in conjunction with FIGS. 4-10. Starting first with FIG. 4, a top view of a portion of an amplifier 400 is shown, which includes a silicon driver stage IC die 410 electrically coupled to a GaN final stage IC die 480, in accordance with an example embodiment. FIG. 4 should be viewed in parallel with FIG. 5, which is a cross-sectional, side view of the amplifier 400 of FIG. 4 along line 5-5. The various components of the amplifier 400 correspond with components depicted in the circuit diagram of FIG. 2. More particularly, corresponding components between FIG. 2 and FIGS. 4 and 5 have the same last two numerical digits (e.g., components 220 and 420 are corresponding components, and components 228 and 528 are corresponding components).

In the layout of the silicon driver stage IC die 410, certain components of the input impedance matching circuit 430, the interstage impedance matching circuit 450, the bias voltage control circuit 460, and the harmonic control circuit 470 are duplicated in a parallel and symmetrical manner, as discussed above in conjunction with FIG. 2. To avoid cluttering FIG. 4, reference numbers are not attached to both components in each set of corresponding parallel components. It should be understood which components correspond with each other based on their symmetrical placement and identical depictions. Further, although a symmetrical layout is depicted, in other embodiments, the corresponding parallel sub-circuits and components may be combined together into a single sub-circuit or component, with component values that have substantially equivalent electrical characteristics as the parallel sub-circuit or component embodiments.

Amplifier 400 includes a silicon driver stage IC die 410 (e.g., silicon IC die 210, FIG. 2) and a GaN final stage IC die 480 (e.g., GaN IC die 280, FIG. 2), which are electrically coupled together in a cascade arrangement between an RF signal input terminal 420 (e.g., input terminal 220, FIG. 2) of die 210 and an RF signal output terminal 492 (e.g., output terminal 292, FIG. 2) of die 480. In various embodiments, the silicon driver stage IC die 410 and the GaN final stage IC die 480 may be physically and electrically coupled to a substrate 406. For example, the substrate 406 may be a printed circuit board (PCB), a conductive flange (e.g., a portion of a leadframe or an individual conductive component), or another suitable substrate. In various embodiments, at least those portions of the surface of the flange 406 to which the die 410, 480 are attached are electrically conductive. In some embodiments, such conductive portions of the substrate 406 may be electrically coupled to system ground. In addition, such conductive portions of the substrate 406 also may function as heat sinks for dissipating heat generated by the dies 410, 480 during operation. For example, conductive coins 550, 552 or thermal vias (not illustrated) may be embedded in the substrate 406, and the dies 410, 480 may be physically coupled to the conductive coins or thermal vias. These coins, vias, or other conductive features, thus, may function as connections to system ground and as heat sinks for the dies 410, 480 during operation.

Figure 5:
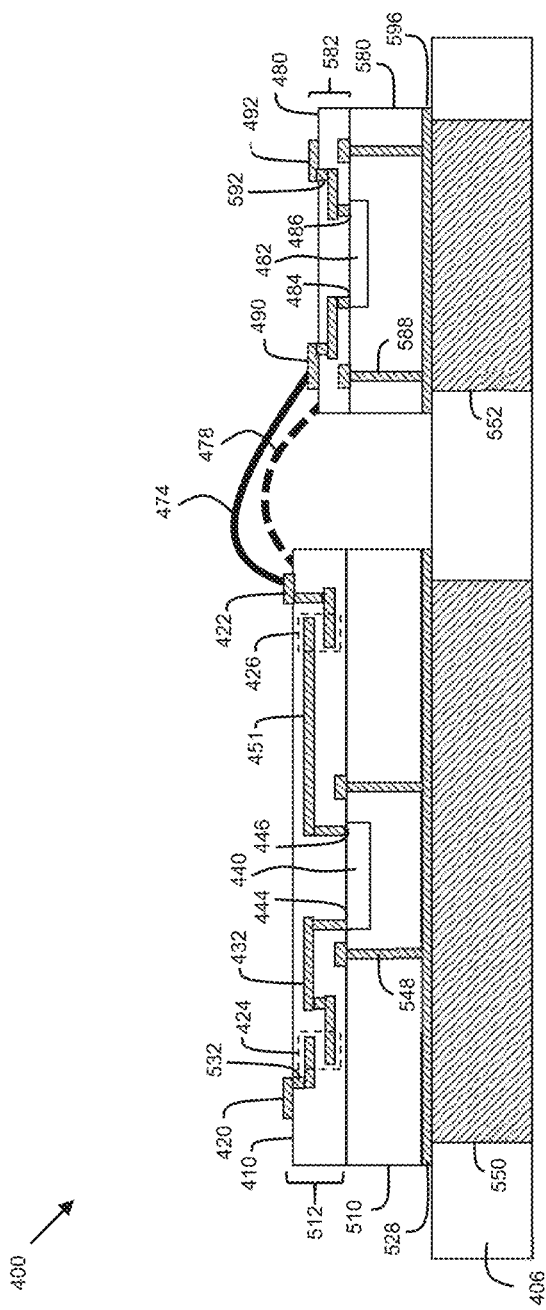
FIG. 5 is a cross-sectional, side view of the amplifier portion of FIG. 4 along line 5-5, in accordance with an example embodiment.

Referring to FIG. 5, the silicon driver stage IC die 410 includes a silicon substrate 510 and a plurality of build-up layers 512 over a top surface of the silicon substrate 510. The plurality of build-up layers 512 may include, for example, a plurality of interleaved dielectric layers and patterned conductive layers. Portions of different patterned conductive layers are electrically coupled with conductive vias (e.g., via 532). Further, conductive through substrate vias (TSVs) (e.g., via 548) may provide conductive paths between the top and bottom surfaces of the silicon substrate 510. According to an embodiment, a conductive layer 528 on the bottom surface of the silicon substrate 510 functions as a ground node for the die 410 (e.g., corresponding to ground node 228, FIG. 2). Although not shown in FIG. 5, the conductive layer 528 may be physically an electrically coupled to a ground node of the substrate 406 to which the die 410 is attached, as described above.

In the below description of the silicon driver stage IC die 410, reference will be made to various circuits that include capacitors, inductors, and/or resistors. The capacitors 424, 426, 431, 436, 453, 456, 472 may be, for example, integrated metal-insulator-metal (MIM) capacitors formed within the build-up layers 512, and/or small chip capacitors (discrete capacitors) coupled to the top surface of the die 410, in various embodiments. The resistors 233, 234, 254 may be, for example, integrated resistors (e.g., formed from polysilicon), or small discrete resistors coupled to the top surface of the die 410. The inductors 432, 435, 451, 452, 455 may be integrated spiral inductors, as shown, or may be discrete inductors or inductances formed from wirebonds or other inductive components.

Referring to both FIG. 4 and FIG. 5, the silicon driver stage IC die 410 includes a plurality of circuits integrated within the silicon IC die 410. In an embodiment, the integrated circuitry of die 410 includes an input terminal 420 (e.g., input terminal 220, FIG. 2), an output terminal 422 (e.g., output terminal 222, FIG. 2), a first DC blocking/AC decoupling capacitor 424 (e.g., capacitor 224, FIG. 2), a second DC blocking/AC decoupling capacitor 426 (e.g., capacitor 226, FIG. 2), an input impedance matching circuit 430 (e.g., circuit 230, FIG. 2), a power transistor 440 (e.g., transistor 240, FIG. 2), an integrated portion of an interstage impedance matching circuit 450 (e.g., circuit 250, FIG. 2), a bias voltage control circuit 460 (e.g., circuit 260, FIG. 2), and an integrated portion of a harmonic control circuit 470 (e.g., circuit 270, FIG. 2), in an embodiment.

The power transistor 440 is the primary amplification component of the silicon driver stage IC die 410. In an embodiment, power transistor 440 includes a FET (e.g., an LDMOS FET) with a gate terminal 444 (control terminal), a drain terminal 446 (first current-conducting terminal), and a source terminal (second current conducting terminal, not numbered). In alternate embodiments, the power transistor 440 may include a CMOS power amplifier configuration (e.g., as in the embodiment described in conjunction with FIG. 3). In the embodiment of FIG. 4, the source terminal is electrically coupled to a ground node (e.g., the source terminal is electrically coupled to the conductive layer 528 on the bottom surface of the silicon IC die 410 through one or more TSVs 548 or a doped sinker region).

The input terminal 420 may be a conductive bondpad, for example, which is exposed at the top surface of the die 410, and which is configured for attachment of wirebonds (e.g., corresponding to connection 103, 203, FIGS. 1, 2). Alternatively, as mentioned previously, dies 410 and/or 480 may be flip-chip dies or otherwise configured to receive and convey DC bias and RF signals through substrate 406, in which case the input terminal 420 (and terminals 422, 471, 490, 492, 494) may consist of conductive lands or other types of connections. The first DC blocking/AC decoupling capacitor 424 has a first terminal electrically coupled to the input terminal 420, and a second terminal electrically coupled to the input impedance matching circuit 430. The first DC blocking/AC decoupling capacitor 424 may be, for example, a metal-insulator-metal (MIM) capacitor formed within the build-up layers 512, or a tiny chip capacitor coupled to the top surface of the die 410, in various embodiments.

The input impedance matching circuit 430 is electrically coupled between the second terminal of the DC blocking/AC decoupling capacitor 424 and the gate terminal 444 of the power transistor 440. The input impedance matching circuit 430 includes the first DC blocking/AC decoupling capacitor 424, a second capacitor 431 (e.g., capacitor 231, FIG. 2), a first inductor 432 (e.g., inductor 232, FIG. 2), a first resistor 433 (e.g., resistor 233, FIG. 2), and a shunt circuit that includes a series combination of a second resistor 434 (e.g., resistor 234, FIG. 2), a second inductor 435 (e.g., inductor 235, FIG. 2), and a third capacitor 436 (e.g., capacitor 236, FIG. 2). The second capacitor 431 includes a first terminal coupled to the second terminal of the DC blocking/AC decoupling capacitor 424, and a second terminal coupled to the conductive layer 528 on the bottom surface of the die 410 (e.g., to ground node 228, FIG. 2). The first inductor 432 includes a first terminal coupled to the second terminal of the DC blocking/AC decoupling capacitor 424 (and to the first terminal of capacitor 431), and a second terminal coupled to the gate terminal 444 of the power transistor 440 through the first resistor 433. The shunt circuit includes the second resistor 434, the second inductor 435, and the third capacitor 436 electrically coupled between the gate terminal 444 of the power transistor 440 and the ground node (e.g., the conductive layer 528 on the bottom surface of the die 410). In alternate embodiments, the order of the second resistor 434, the second inductor 435, and the third capacitor 436 may be different from the order depicted in FIG. 4.

A gate bias voltage, $Vg1$, for the power transistor 440 is provided to the gate terminal 444 of the power transistor 440 through the shunt circuit of the input impedance matching circuit 430, in an embodiment. More particularly, the gate bias voltage may be provided through an input terminal 437, which is electrically coupled to a node of the shunt circuit (e.g., a node connected to the third capacitor 436).

The integrated portion of the interstage impedance matching circuit 450 is electrically coupled between the drain terminal 446 of the power transistor 440, and the output terminal 422. The integrated portion of the interstage impedance matching circuit 450 includes a first inductor 451 (e.g., inductor 251, FIG. 2), a first shunt circuit, the second DC blocking/AC decoupling capacitor 426, and a second shunt circuit. The first inductor 451 includes a first terminal coupled to the drain terminal 446 of the power transistor 440, and a second terminal coupled to a first terminal of the second DC blocking/AC decoupling capacitor 426. The first shunt circuit includes a series combination of a second inductor 452 (e.g., inductor 252, FIG. 2) and a first capacitor 453 (e.g., capacitor 253, FIG. 2) electrically coupled between the second terminal of the first inductor 451 (and the first terminal of the second DC blocking/AC decoupling capacitor 426) and the ground node (e.g., the conductive layer 528 on the bottom surface of the die 410). The second shunt circuit includes a series combination of a first resistor 454 (e.g., resistor 254, FIG. 2), a third inductor 455 (e.g., inductor 255, FIG. 2), and a second capacitor 456 (e.g., capacitor 256, FIG. 2) electrically coupled between the output terminal 422 (and the second terminal of the second DC blocking/AC decoupling capacitor 426) and the ground node (e.g., the conductive layer 528 on the bottom surface of the die 410). In alternate embodiments, the order of the resistor 454, the inductor 455, and the capacitor 456 may be different from the order depicted in FIG. 4.

The drain bias voltage, $Vd1$, for the power transistor 440 is provided to the drain terminal 446 of the power transistor 444 through the first shunt circuit of the interstage impedance matching circuit 450, in an embodiment. More particularly, the drain bias voltage may be provided through an input terminal 457, which is electrically coupled to a node of the shunt circuit (e.g., to the first capacitor 453).

As discussed previously, the gate bias voltage, $Vg2$, for the power transistor 482 of the GaN final stage IC die 480 is provided through a portion of the second shunt circuit of the interstage impedance matching circuit 450, in an embodiment. More specifically, an integrated gate bias voltage circuit 460 includes an input terminal 458 (e.g., input terminal 258, FIG. 2), inductor 455, and resistor 454, in an embodiment. During operation, a DC voltage may be provided through the input terminal 458 (e.g., by an external voltage source, such as source 164, FIG. 1), which is electrically coupled to a node of the shunt circuit (e.g., to capacitor 456). The integrated gate bias voltage circuit 460 then converts the received voltage into a DC gate bias voltage, Vg2, for the GaN transistor 482.

The silicon driver stage IC die 410 also includes an integrated portion of a harmonic control circuit 470, in an embodiment, which is electrically coupled to the gate terminal 484 of the power transistor 482 of the GaN final stage IC die 480. The integrated portion of a harmonic control circuit 470 includes an input terminal 471 (e.g., input terminal 271, FIG. 2), and a capacitor 472 (e.g., capacitor 272, FIG. 2), which is electrically coupled between the input terminal 471 and the ground node (e.g., the conductive layer 528 on the bottom surface of the die 410), in an embodiment. The input terminal 471 is electrically coupled, via one or more wirebonds 478 or other electrical connections (e.g., corresponding to connection 278, FIG. 2), to terminal 494 (e.g., terminal 294, FIG. 2) of the GaN final stage IC die 480. Terminals 471 and 494 may be conductive bondpads, for example, which are exposed at the top surfaces of the dies 410, 480, respectively, and which are configured for attachment of wirebonds (e.g., wirebonds 478). Terminal 494 is electrically coupled to the gate terminal 484 of the power transistor 482 of the GaN final stage IC die 480. Together, the series combination of the electrical connection 478 and the capacitor 472 correspond to a series inductor-capacitor (LC) harmonic termination circuit, which provides a low impedance path to the ground node for signal energy at the second harmonic, $2f_0$, of the center operating frequency, $f_0$, of the amplifier 400.

As stated above, the silicon driver stage IC die 410 (e.g., silicon IC die 210, FIG. 2) is electrically coupled to the GaN final stage IC die 480 (e.g., GaN IC die 280, FIG. 2). In an embodiment, the silicon IC die 410 is electrically coupled to the GaN IC die 480 through a wirebond array 474 (e.g., corresponding to connection 274, FIG. 2) between the output terminal 422 of the silicon IC die 410 and an input terminal 490 of the GaN IC die 480. In such an embodiment, the output terminal 422 of the silicon IC die 410 and the input terminal 490 of the GaN IC die 480 each may be a conductive bondpad, for example, which is exposed at the top surface of the die 410 or 480, respectively, and which is configured for attachment of wirebonds (e.g., wirebonds 474). As shown in FIG. 4, the wirebond array 274 includes a plurality of wirebonds, where each wirebond has a first end connected to the output terminal 422 of the silicon IC die 410, and a second end connected to the input terminal 490 of the GaN IC die 480. Although four wirebonds are shown to constitute array 474, more or fewer wirebonds may be used in other embodiments. Alternatively, as mentioned previously, the inductive connection implemented with wirebond array 474 may instead include a differently-configured type of DC-coupled connection.

As indicated previously, the wirebond array 474 (or other electrical connection) may have a dual function. The first function is to convey the gate bias voltage, Vg2, for the power transistor 482 of the GaN final stage IC die 480 from the gate bias voltage control circuit 460 to the gate terminal 484 of the power transistor 482. The second function is to provide a non-integrated portion of the interstage impedance matching circuit 450. The profile of the wirebond array 474 (e.g., the height, length, shape of the wirebonds in the array 474), as shown more clearly in FIG. 5, is designed to compensate the gate-source capacitance, Cgs, of the GaN transistor 482, in an embodiment. Although a particular profile is illustrated in FIG. 5, the profile may be different, in other embodiments.

Referring still to FIG. 5, the GaN final stage IC die 480 includes a GaN substrate 580 and a plurality of build-up layers 582 over a top surface of the GaN substrate 580. The plurality of build-up layers 582 may include, for example, a plurality of interleaved dielectric layers and patterned conductive layers. Portions of different patterned conductive layers are electrically coupled with conductive vias (e.g., via 592). Further, conductive TSVs (e.g., via 588) may provide conductive paths between the top and bottom surfaces of the GaN substrate 580. According to an embodiment, a conductive layer 596 on the bottom surface of the GaN substrate 580 functions as a ground node for the die 480 (e.g., corresponding to ground node 296, FIG. 2). Although not shown in FIG. 5, the conductive layer 596 may be physically an electrically coupled to a ground node of the substrate 406 to which the die 480 is attached, as described above.

Referring to both FIG. 4 and FIG. 5, the GaN final stage IC die 480 includes a plurality of circuits integrated within a GaN IC die. The integrated circuitry of die 480 includes an input terminal 490 (e.g., input terminal 290, FIG. 2), an output terminal 492 (e.g., output terminal 292, FIG. 2), and a power transistor 482 (e.g., transistor 282, FIG. 2), in an embodiment.

The power transistor 482 is the primary amplification component of the GaN final stage IC die 480. In an embodiment, power transistor 482 includes a FET (e.g., a high electron mobility transistor (HEMT)) with a gate terminal 484 (control terminal), a drain terminal 486 (first current-conducting terminal), and a source terminal 488 (second current conducting terminal). The input terminal 490 is coupled to the gate terminal 484 of the GaN transistor 482. The drain terminal 486 of the GaN transistor 482 is coupled to the output terminal 492, and the source terminal 488 of the GaN transistor 482 is electrically coupled to a ground node (e.g., the source terminal is electrically coupled to the conductive layer 596 on the bottom surface of the GaN IC die 410 through one or more TSVs 588 or a doped sinker region). The output terminal 492 may be a conductive bondpad, for example, which is exposed at the top surface of the die 480, and which is configured for attachment of wirebonds or other electrical connections (e.g., corresponding to connection 279, FIG. 2).

Figure 6:
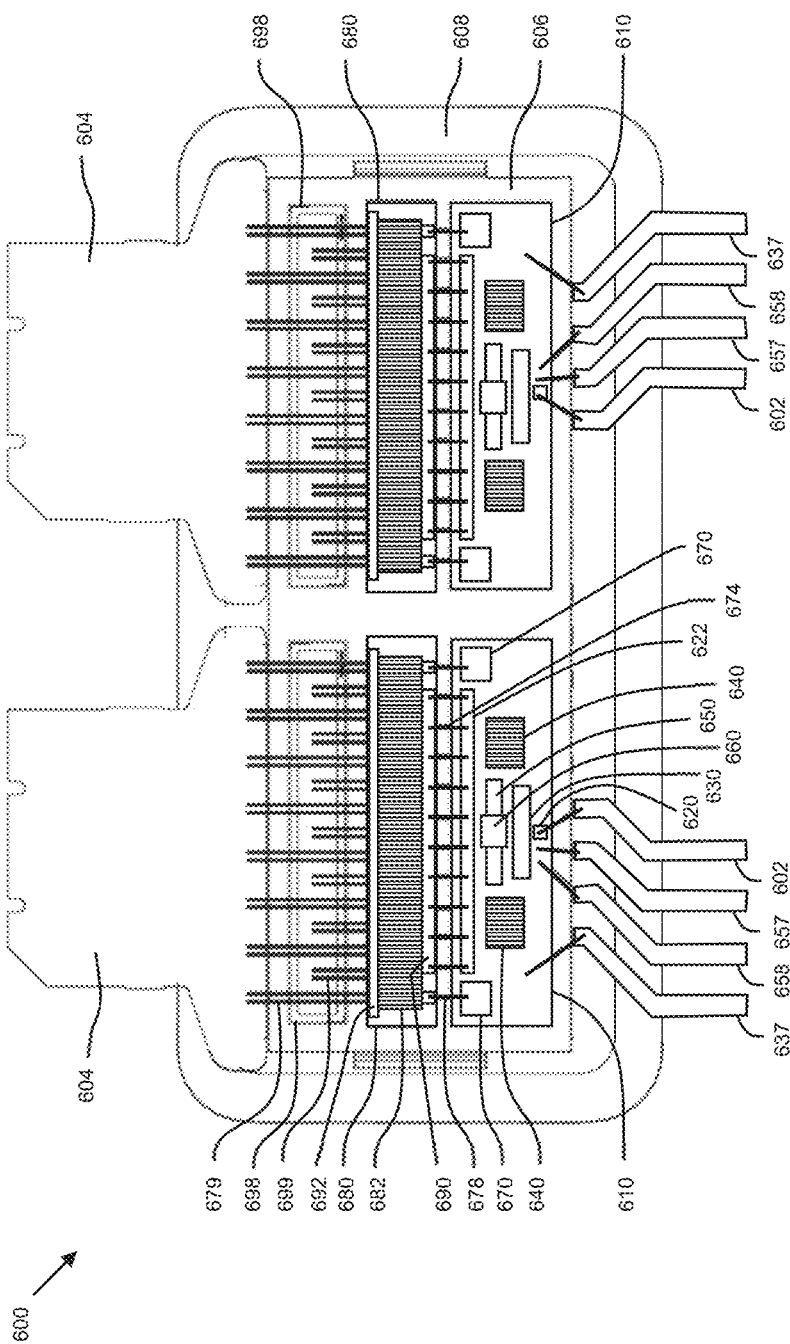
FIG. 6 is a top view of an example of an RF amplifier device that includes a two-stage amplifier packaged in a high-power package, in accordance with an example embodiment.

Turning next to FIG. 6, a top view of an example of a packaged RF amplifier device 600 is illustrated, which includes a two-stage amplifier packaged in a high-power semiconductor device package, in accordance with an example embodiment. More specifically, the device 600 includes two parallel amplification paths housed in a high-power semiconductor device package. For purpose of brevity, many of the components and circuits of FIG. 6 that have similar counterparts in the embodiments of FIGS. 1-5 are not discussed in detail below. The details of corresponding components discussed above in conjunction with FIGS. 1-5 are intended to apply also to the corresponding components discussed below in conjunction with FIG. 6. Once again, the various components of the amplifier 600 correspond with components depicted in FIGS. 1-5. More particularly, corresponding components between FIG. 6 and FIGS. 1-5 have the same last two numerical digits (e.g., components 220 and 620 are corresponding components, and components 406 and 606 are corresponding components).

Each amplification path includes a silicon driver stage IC die 610 (e.g., silicon driver stage IC die 110, 210, 310, 410), a GaN final stage IC die 680 (e.g., GaN final stage IC die 180, 280, 380, 480), and an output "Integrated Passive Device" (IPD) 698 physically connected to the top surface of a substrate 606, in accordance with an example embodiment. Further, each of the amplification paths is electrically coupled between input and output leads 602, 604 (e.g., corresponding to inputs 102, 202, 302 and outputs 104, 204, 304, respectively). Bias leads 637, 657, 658 may be coupled to external bias circuitry (e.g., external bias voltage source 164) to receive gate and drain bias voltages, and to convey the bias voltages to circuitry internal to the device 600.

According to an embodiment, device 600 may be incorporated in an air cavity package, in which dies 610, 680 and IPDs 698 are located within an enclosed air cavity. Basically, the air cavity is bounded by substrate 606, an isolation structure 608 attached to the top surface of substrate 606, and a cap (not shown) overlying and in contact with the isolation structure 608 and the leads 602, 604, 637, 657, 658. The input, output, and bias leads 602, 604, 637, 657, 658 are mounted on a top surface of the isolation structure 606 on opposed sides of a central opening. In other embodiments, a device may be incorporated into an overmolded package (i.e., a package in which the electrical components within the active device area are encapsulated with a non-conductive molding compound, and in which portions of the leads 602, 604, 637, 657, 658 also may be encompassed by the molding compound).

Either way, the substrate 606 has a top and bottom surface (only the top surface is visible in FIG. 6), and a substantially-rectangular perimeter that corresponds to the perimeter of the device 600. In an embodiment, the substrate 606 includes a flange, which is a rigid electrically-conductive substrate formed from a solid conductive material, and which has a thickness that is sufficient to provide structural support for electrical components and elements of device 600. In addition, the flange may function as a heat sink for the amplifier dies 610, 680 and other devices mounted on the flange. Alternatively, substrate 606 may have one or more layers of non-conductive material below its top surface. Either way, substrate 606 has a conductive top surface.

The below description will describe a first one of the amplification paths in more detail. It is to be understood that the second amplification path may be identical to or substantially similar to the first amplification path. However, in other embodiments, the second amplification path may be differently configured from the first amplification path. Further, in other embodiments, more than two amplification paths may be housed together in a high-power semiconductor device package.

The first amplifier path includes a silicon driver stage IC die 610, a GaN final stage IC die 680, and an IPD 698, which are electrically coupled together in a cascade arrangement between an RF signal input lead 602 (e.g., input 102, 202, 302) and an RF signal output lead 604 (e.g., output 102, 202, 302).

The silicon driver stage IC die 610 includes a plurality of integrated circuits. In an embodiment, the integrated circuitry of die 610 includes an input terminal 620 (e.g., input terminal 120, 220, 320, 420), an output terminal 622 (e.g., output terminal 122, 222, 322, 422), an input impedance matching circuit 630 (e.g., circuit 130, 230, 330, 430), a silicon power transistor 640 (e.g., transistor 140, 240, 340-344, 440), an integrated portion of an interstage impedance matching circuit 650 (e.g., circuit 150, 250, 350, 450), a bias voltage control circuit 660 (e.g., circuit 160, 260, 360, 460), and an integrated portion of a harmonic control circuit 670 (e.g., circuit 170, 270, 370, 470), in an embodiment. The various circuits and components within the silicon driver stage IC die 610 may be configured and electrically coupled together as described previously in conjunction with FIGS. 1-5. In the embodiment illustrated in FIG. 6, the silicon power transistor 640 is implemented in two, parallel sections. In other embodiments, the silicon power transistor 640 may be implemented in a single section, or in more than two sections.

The RF signal input lead 602 is electrically coupled to the input terminal 620 of the silicon driver stage IC die 610 through one or more wirebonds or other electrical connections (e.g., corresponding to connection 103, 203, 303, 403). Bias leads 637, 657, 658 are electrically coupled (e.g., via terminals 158, 237, 257, 258, 337, 357, 358 or 437, 457, 458) to corresponding bias voltage control circuitry connected to the silicon transistor gate, bias voltage control circuitry connected to the silicon transistor drain, and bias voltage control circuitry 660 for the GaN transistor, respectively.

The GaN final stage IC die 680 includes a plurality of integrated circuits. In an embodiment, the integrated circuitry of die 680 includes an input terminal 690 (e.g., input terminal 190, 290, 390, 490), an output terminal 692 (e.g., output terminal 192, 292, 392, 492), and a GaN power transistor 682 (e.g., transistor 182, 282, 382, 482). The various circuits and components within the GaN final stage IC die 680 may be configured and electrically coupled together as described previously in conjunction with FIGS. 1-5.

The output terminal 622 of the silicon driver stage IC die 610 is electrically coupled to the input terminal 690 of the GaN final stage IC die 680 through a wirebond array 674 (e.g., corresponding to connections 174, 274, 374, 474). The input terminal 690 is electrically coupled to the gate of the GaN power transistor 682. The gate of the GaN power transistor 682 also is electrically coupled through one or more wirebonds 678 (e.g., corresponding to connections 178, 278, 378, 478) to the integrated portion of a harmonic control circuit 670 in the silicon driver stage IC die 610.

The output terminal 692 of the GaN final stage IC die 680 is electrically coupled, through wirebond array 679 (e.g., corresponding to connections 179, 279) to output lead 604. According to an embodiment, the wirebond array 679 may form a series circuit of an output impedance matching circuit, which may also include a shunt circuit. For example, the shunt circuit of the output matching circuit may include one or more passive components (e.g., capacitors, inductors, and resistors) implemented in IPD 698. More specifically, the shunt circuit may include a shunt capacitor with a first terminal that is electrically coupled to the output terminal 692 of the GaN final stage IC die 680, and a second terminal that is electrically coupled to a ground node.

According to an embodiment, IPD 698 may include a plurality of passive components that are integrated in a silicon die and/or connected to a top surface of the silicon die. For example, the IPD 698 may include one or more capacitors (e.g., MIM capacitors, discrete chip capacitors, and so on), one or more inductors (e.g., integrated spiral inductors, integrated conductive traces, wirebond arrays, discrete inductors, and so on), and/or one or more resistors (e.g., integrated polysilicon resistors, integrated conductive traces, discrete resistors, and so on), which are electrically coupled together to form one or more portions of an output impedance matching circuit. In various embodiments, the output impedance matching circuit may include a low pass circuit, a high pass circuit, a bandpass circuit, or a combination thereof. In other embodiments, the IPD 698 may be implemented in a die that utilizes a different semiconductor substrate (e.g., a gallium arsenide (GaAs) substrate, a GaN substrate, or another type of substrate), or the IPD 698 may be implemented as a discrete ceramic assembly (e.g., a Low Temperature Co-fired Ceramic (LTCC) structure).

Wirebonds 699 between the output terminal 692 and the IPD 698 may function as a shunt inductive component of the output matching circuit. The variously connected capacitors, inductors, and/or resistors within the IPD 698 are electrically coupled to the wirebonds 699, and may function as additional shunt components in the shunt circuit of the output impedance matching circuit. In alternate embodiments, the shunt circuit of the output matching circuit (and thus the IPD 698 and wirebonds 699) may be excluded from the device 600.

Besides the potential advantages discussed above with respect to the previously-discussed devices (e.g., devices 100, 200, 300, 400, FIGS. 1-4), the device 600 of FIG. 6 may have additional advantages over conventional devices. For example, utilization of IPD 698 may provide for increased output impedance for the device 600, thus decreasing the amount of output impedance matching that needs to be implemented on the PCB to which device 600 is coupled to match the load impedance (e.g., 50 ohms).

Figure 7:
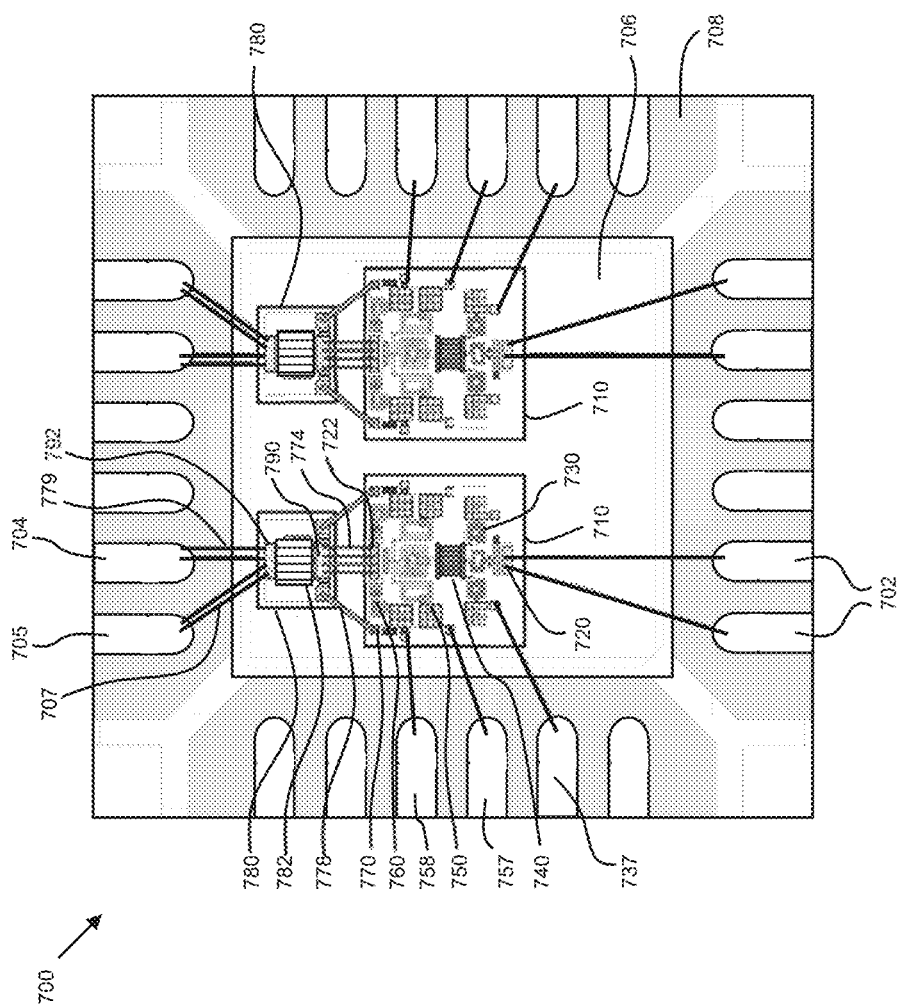
FIG. 7 is a top view of an example of an RF amplifier device that includes a two-stage amplifier packaged in a quad flat no-leads package, in accordance with an example embodiment.

Turning next to FIG. 7, a top view of an example of a packaged RF amplifier device 700 is illustrated, which includes a two-stage amplifier packaged in a quad flat no-leads (QFN) semiconductor device package, in accordance with an example embodiment. More specifically, the device 700 includes two parallel amplification paths housed in a QFN semiconductor device package. For purpose of brevity, many of the components and circuits of FIG. 7 that have similar counterparts in the embodiments of FIGS. 1-5 are not discussed in detail below. The details of corresponding components discussed above in conjunction with FIGS. 1-5 are intended to apply also to the corresponding components discussed below in conjunction with FIG. 7. Once again, the various components of the amplifier 700 correspond with components depicted in FIGS. 1-5. More particularly, corresponding components between FIG. 7 and FIGS. 1-5 have the same last two numerical digits (e.g., components 220 and 720 are corresponding components, and components 406 and 706 are corresponding components).

The QFN package includes a conductive substrate 706 and a plurality of perimeter lands (e.g., lands 702, 704, 737, 757, 758) that are physically coupled together with non-conductive encapsulation 708. Each amplification path includes a silicon driver stage IC die 710 (e.g., silicon driver stage IC die 110, 210, 310, 410) and a GaN final stage IC die 780 (e.g., GaN final stage IC die 180, 280, 380, 480) physically connected to the top surface of the substrate 706, in accordance with an example embodiment. Further, each of the amplification paths is electrically coupled between input and output lands 702, 704 (e.g., corresponding to inputs 102, 202, 302 and outputs 104, 204, 304, respectively). Bias lands 737, 757, 758 may be coupled to external bias circuitry (e.g., external bias voltage source 164) to receive gate and drain bias voltages, and to convey the bias voltages to circuitry internal to the device 700.

In an embodiment, the substrate 706 includes a flange, which is a rigid electrically-conductive substrate formed from a solid conductive material, and which has a thickness that is sufficient to provide structural support for electrical components and elements of device 700. In addition, the flange may function as a heat sink for the amplifier dies 710, 780 and other devices mounted on the flange.

The below description will describe a first one of the amplification paths in more detail. It is to be understood that the second amplification path may be identical to or substantially similar to the first amplification path. However, in other embodiments, the second amplification path may be differently configured from the first amplification path. Further, in other embodiments, more than two amplification paths may be housed together in a QFN semiconductor device package.

The first amplifier path includes a silicon driver stage IC die 710 and a GaN final stage IC die 780, which are electrically coupled together in a cascade arrangement between an RF signal input land 702 (e.g., input 102, 202, 302) and an RF signal output land 704 (e.g., output 102, 202, 302).

The silicon driver stage IC die 710 includes a plurality of integrated circuits. In an embodiment, the integrated circuitry of die 710 includes an input terminal 720 (e.g., input terminal 120, 220, 320, 420), an output terminal 722 (e.g., output terminal 122, 222, 322, 422), an input impedance matching circuit 730 (e.g., circuit 130, 230, 330, 430), a silicon power transistor 740 (e.g., transistor 140, 240, 340-344, 440), an integrated portion of an interstage impedance matching circuit 750 (e.g., circuit 150, 250, 350, 450), a bias voltage control circuit 760 (e.g., circuit 160, 260, 360, 460), and an integrated portion of a harmonic control circuit 770 (e.g., circuit 170, 270, 370, 470), in an embodiment. The various circuits and components within the silicon driver stage IC die 710 may be configured and electrically coupled together as described previously in conjunction with FIGS. 1-5.

The RF signal input land 702 is electrically coupled to the input terminal 720 of the silicon driver stage IC die 710 through one or more wirebonds or other electrical connections (e.g., corresponding to connection 103, 203, 303, 403). Bias lands 737, 757, 758 are electrically coupled (e.g., via terminals 158, 237, 257, 258, 337, 357, 358 or 437, 457, 458) to corresponding bias voltage control circuitry connected to the silicon transistor gate, bias voltage control circuitry connected to the silicon transistor drain, and bias voltage control circuitry 760 for the GaN transistor, respectively.

The GaN final stage IC die 780 includes a plurality of integrated circuits. In an embodiment, the integrated circuitry of die 780 includes an input terminal 790 (e.g., input terminal 190, 290, 390, 490), an output terminal 792 (e.g., output terminal 192, 292, 392, 492), and a GaN power transistor 782 (e.g., transistor 182, 282, 382, 482). The various circuits and components within the GaN final stage IC die 780 may be configured and electrically coupled together as described previously in conjunction with FIGS. 1-5.

The output terminal 722 of the silicon driver stage IC die 710 is electrically coupled to the input terminal 790 of the GaN final stage IC die 780 through a wirebond array 774 or other type of electrical connection (e.g., corresponding to connections 174, 274, 374, 474). The input terminal 790 is electrically coupled to the gate of the GaN power transistor 782. The gate of the GaN power transistor 782 also is electrically coupled through one or more wirebonds 778 or other type of electrical connection (e.g., corresponding to connections 178, 278, 378, 478) to the integrated portion of a harmonic control circuit 770 in the silicon driver stage IC die 710.

The output terminal 792 of the GaN final stage IC die 780 is electrically coupled, through wirebond array 779 or other type of electrical connection (e.g., corresponding to connections 179, 279) to output land 704. According to an embodiment, an additional bias land 705 may be electrically coupled to the output terminal 792 of the GaN final stage IC die 780 through an additional wirebond array 707 or other type of electrical connection. A drain bias voltage may be provided to the drain terminal of the GaN transistor 782 by an external bias voltage source connected to bias land 705.

Figure 8:
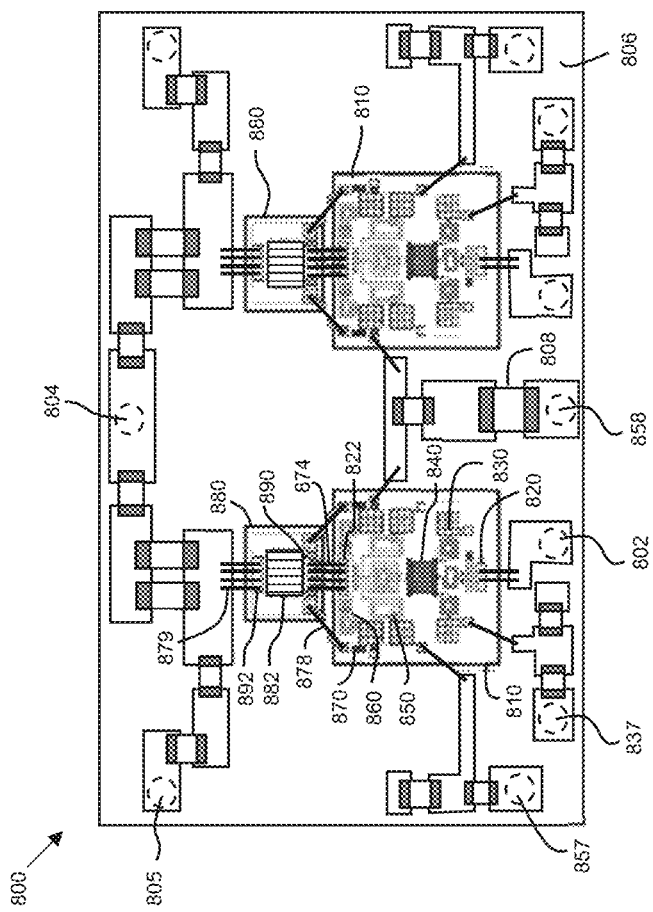
FIG. 8 is a top view of an example of an RF amplifier device that includes two, two-stage amplifiers in a two-path amplifier module, in accordance with an example embodiment.

Turning next to FIG. 8, a top view of an example of an RF amplifier device 800 is illustrated, which includes a two-stage amplifier packaged in a leadless printed circuit board (PCB) module, in accordance with an example embodiment. More specifically, the device 800 includes two parallel amplification paths housed in the PCB module. For purpose of brevity, many of the components and circuits of FIG. 8 that have similar counterparts in the embodiments of FIGS. 1-5 are not discussed in detail below. The details of corresponding components discussed above in conjunction with FIGS. 1-5 are intended to apply also to the corresponding components discussed below in conjunction with FIG. 8. Once again, the various components of the amplifier 800 correspond with components depicted in FIGS. 1-5. More particularly, corresponding components between FIG. 8 and FIGS. 1-5 have the same last two numerical digits (e.g., components 220 and 820 are corresponding components, and components 406 and 806 are corresponding components).

The PCB module includes a multiple-layer PCB 806, which includes at least one dielectric layer (e.g., formed from FR-4, ceramic, or other PCB dielectric materials), and two or more conductive layers. In an embodiment, the conductive layer on the top surface of the PCB 806 is a patterned conductive layer. Various conductive features (e.g., conductive pads and traces) formed from portions of the top patterned conductive layer may serve as attachment points for dies 810, 880 and other discrete components, and also may provide electrical connectivity between the dies 810, 880 and the other discrete components. Another conductive layer may serve as a ground reference plane. In some embodiments, one or more additional patterned conductive layers may provide conductive connections between the dies 810, 880, the discrete components, and the ground reference plane.

Each amplification path includes a silicon driver stage IC die 810 (e.g., silicon driver stage IC die 110, 210, 310, 410) and a GaN final stage IC die 880 (e.g., GaN final stage IC die 180, 280, 380, 480) physically connected to the top surface of the PCB 806, in accordance with an example embodiment. Further, each of the amplification paths is electrically coupled between input and output terminals 802, 804 (e.g., corresponding to inputs 102, 202, 302 and outputs 104, 204, 304, respectively). Bias terminals 805, 837, 857, 858 may be coupled to external bias circuitry (e.g., external bias voltage source 164) to receive gate and drain bias voltages, and to convey the bias voltages to circuitry of the device 800. In an embodiment in which device 800 is a surface-mount device, the terminals 802, 804, 805, 837, 857, 858 may include conductive features on the top surface of the PCB 806, conductive features on the bottom surface of the PCB 806, and conductive vias extending through the PCB 806 between the top and bottom conductive features (as indicated with dashed circles).

The below description will describe a first one of the amplification paths in more detail. It is to be understood that the second amplification path may be identical to or substantially similar to the first amplification path. However, in other embodiments, the second amplification path may be differently configured from the first amplification path. Further, in other embodiments, more than two amplification paths may be housed together in a PCB module.

The first amplifier path includes a silicon driver stage IC die 810 and a GaN final stage IC die 880, which are electrically coupled together in a cascade arrangement between an RF signal input terminal 802 (e.g., input 102, 202, 302) and an RF signal output terminal 804 (e.g., output 102, 202, 302).

The silicon driver stage IC die 810 includes a plurality of integrated circuits. In an embodiment, the integrated circuitry of die 810 includes an input terminal 820 (e.g., input terminal 120, 220, 320, 420), an output terminal 822 (e.g., output terminal 122, 222, 322, 422), an input impedance matching circuit 830 (e.g., circuit 130, 230, 330, 430), a silicon power transistor 840 (e.g., transistor 140, 240, 340-344, 440), an integrated portion of an interstage impedance matching circuit 850 (e.g., circuit 150, 250, 350, 450), a bias voltage control circuit 860 (e.g., circuit 160, 260, 360, 460), and an integrated portion of a harmonic control circuit 870 (e.g., circuit 170, 270, 370, 470), in an embodiment. The various circuits and components within the silicon driver stage IC die 810 may be configured and electrically coupled together as described previously in conjunction with FIGS. 1-5.

The RF signal input terminal 802 is electrically coupled to the input terminal 820 of the silicon driver stage IC die 810 through a conductive trace and one or more wirebonds or other types of electrical connections (e.g., corresponding to connection 103, 203, 303, 403). Bias terminals 805, 837, 857, 858 are electrically coupled through additional conductive traces, wirebonds, and terminals (e.g., terminals 158, 237, 257, 258, or 337, 357, 358, or 437, 457, 458) to corresponding bias voltage control circuitry connected to the silicon transistor gate, bias voltage control circuitry connected to the silicon transistor drain, and bias voltage control circuitry 860 for the GaN transistor, respectively. In some embodiments, additional bias voltage control circuitry may be implemented on the PCB 806 between the bias terminals 805, 837, 857, 858 and the dies 810, 880, as indicated with PCB-mounted discrete components (e.g., discrete capacitors, inductors, and/or resistors) between the bias terminals 805, 837, 857, 858 and the dies 810, 880 (e.g., discrete component 808).

The GaN final stage IC die 880 includes a plurality of integrated circuits. In an embodiment, the integrated circuitry of die 880 includes an input terminal 890 (e.g., input terminal 190, 290, 390, 490), an output terminal 892 (e.g., output terminal 192, 292, 392, 492), and a GaN power transistor 882 (e.g., transistor 182, 282, 382, 482). The various circuits and components within the GaN final stage IC die 880 may be configured and electrically coupled together as described previously in conjunction with FIGS. 1-5.

The output terminal 822 of the silicon driver stage IC die 810 is electrically coupled to the input terminal 890 of the GaN final stage IC die 880 through a wirebond array 874 or another type of electrical connection (e.g., corresponding to connections 174, 274, 374, 474). The input terminal 890 is electrically coupled to the gate of the GaN power transistor 882. The gate of the GaN power transistor 882 also is electrically coupled through one or more wirebonds 878 or another type of electrical connection (e.g., corresponding to connections 178, 278, 378, 478) to the integrated portion of a harmonic control circuit 870 in the silicon driver stage IC die 810. The output terminal 892 of the GaN final stage IC die 880 is electrically coupled, through wirebond array 879 or another type of electrical connection (e.g., corresponding to connections 179, 279) and additional traces to output pad 804.

The devices 600, 700, 800 depicted in FIGS. 6-8 each include two parallel amplification paths that independently amplify RF input signals to produce separate amplified RF output signals. Other embodiments may include more than two amplification paths (e.g., three, four, or some other number of paths). In some embodiments, multiple amplification paths may be electrically coupled together as part of a multi-path amplifier system. For example, the device embodiments described in conjunction with FIGS. 1-5 may be implemented in a Doherty power amplifier. A two-way Doherty power amplifier includes an RF input configured to receive an RF signal, a signal splitter configured to divide the input RF signal into first and second input RF signals, a main amplification path configured to amplify the first RF signal, a peaking amplification path configured to amplify the second input RF signal, a signal combiner configured to combine the amplified output signals from the main and peaking amplification paths, and an RF output configured to output the combined and amplified RF output signal. In addition, the two-way Doherty power amplifier includes various phase delay and impedance transformation elements, which enable correct operation of the Doherty power amplifier. Some Doherty power amplifier configurations may include more than one peaking amplifier path, and such Doherty power amplifiers are referred to as N-way Doherty power amplifiers, where the number of peaking amplifier paths equals N−1.

Figure 9:
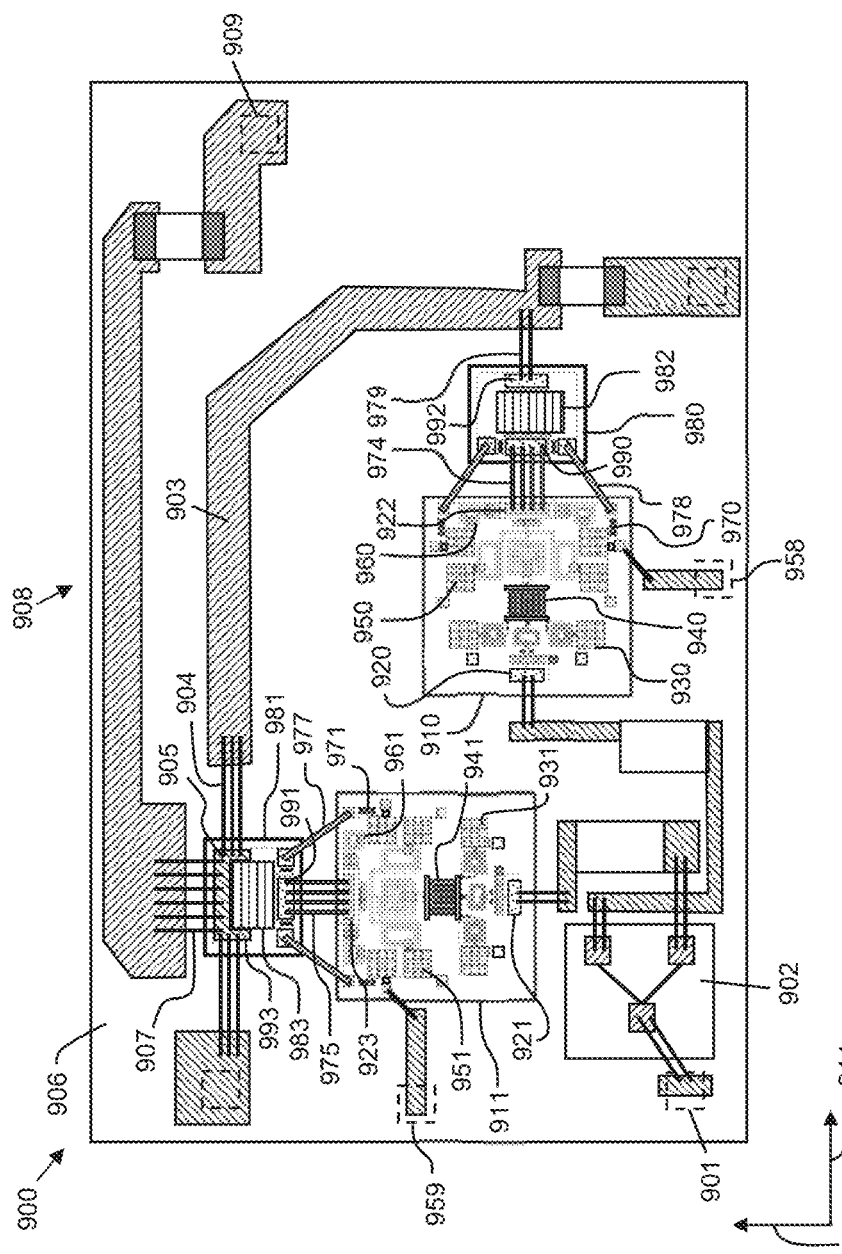
FIG. 9 is a top view of an example of an RF amplifier device that includes a two-stage main amplifier in a Doherty power amplifier module, in accordance with an example embodiment.

In various embodiments, a two-stage amplifier with a silicon driver stage IC die and a GaN final stage IC die is incorporated into one or more amplification paths of a Doherty power amplifier module. For example, such a two-stage amplifier may be incorporated into a main amplification path, a peaking amplification path, multiple peaking amplification paths, or any combination of main and peaking amplification paths. An example embodiment in which two-stage amplifiers, each with a silicon driver stage IC die and a GaN final stage IC die, are incorporated into main and peaking amplification paths is illustrated in FIG. 9. Those of skill in the art would understand, based on the description herein, that other embodiments may include two-stage amplifiers with a silicon driver stage IC die and a GaN final stage IC die in a main amplifier path and multiple peaking amplifier paths.

More specifically, FIG. 9 is a top view of an example of an RF amplifier device 900 that includes a Doherty power amplifier with a main amplification path and a peaking amplification path, where the main amplification path includes a silicon driver stage IC die 910 and a GaN final stage IC die 980, and the peaking amplification path also includes a silicon driver stage IC die 911 and a GaN final stage IC die 981, in accordance with an example embodiment. RF amplifier device 900 will alternatively be referred to below as a "Doherty power amplifier module." For purpose of brevity, many of the components and circuits of FIG. 9 that have similar counterparts in the embodiments of FIGS. 1-5 are not discussed in detail below. The details of corresponding components discussed above in conjunction with FIGS. 1-5 are intended to apply also to the corresponding components discussed below in conjunction with FIG. 9. Once again, the various components of the amplifier 900 correspond with components depicted in FIGS. 1-5. More particularly, corresponding components between FIG. 9 and FIGS. 1-5 have the same last two numerical digits (e.g., components 220 and 920 are corresponding components, and components 406 and 906 are corresponding components).

The Doherty power amplifier module 900 includes a substrate in the form of a multiple-layer PCB 906, which includes at least one dielectric layer (e.g., formed from FR-4, ceramic, or other PCB dielectric materials), and two or more conductive layers. In an embodiment, the conductive layer on the top surface of the PCB 906 is a patterned conductive layer. Various conductive features (e.g., conductive pads and traces) formed from portions of the top patterned conductive layer may serve as attachment points for dies 910, 911, 980, 981 and other discrete components, and also may provide electrical connectivity between the dies 910, 911, 980, 981 and the other discrete components. Another conductive layer may serve as a ground reference plane. In some embodiments, one or more additional patterned conductive layers may provide conductive connections between the dies 910, 911, 980, 981, the discrete components, and the ground reference plane. According to an embodiment, a bottom conductive layer is utilized to provide externally-accessible, conductive landing pads, where the locations of some example landing pads 901, 909, 958, 959 are indicated with dashed boxes in FIG. 9. These landing pads (among others, not illustrated) enable surface mounting of the Doherty power amplifier module 900 onto a separate substrate (not illustrated) that provides electrical connectivity to other portions of an RF system. Although module 900 is depicted as a land grid array (LGA) module, module 900 alternatively may be packaged as a pin grid array module, a QFN module, or another type of package.

The Doherty power amplifier module 900 further includes an RF signal input terminal, a power splitter 902, a two-stage, main amplifier that includes a cascade-coupled silicon driver stage IC die 910 and GaN final stage IC die 980, a two-stage peaking amplifier that includes a cascade-coupled silicon driver stage IC die 911 and GaN final stage IC die 981, various phase shift and impedance matching elements, and a combiner. A conductive landing pad 901 exposed at the bottom surface of the PCB 906 functions as the RF signal input terminal for the module 900. Through one or more conductive structures (e.g., vias, traces, and/or wirebonds), the landing pad 901 is electrically coupled to an input to the power splitter 902.

The power splitter 902, which is coupled to the mounting surface of the PCB 906, may include one or more discrete die and/or components, although it is represented in FIG. 9 as a single element. The power splitter 902 includes an input terminal and two output terminals. The input terminal is electrically coupled through one or more conductive structures (e.g., vias, traces, and/or wirebonds) to the landing pad 901 to receive an input RF signal. The output terminals of the power splitter 902 are electrically coupled through one or more conductive structures (e.g., vias, traces, and/or wirebonds) to inputs 920, 921 for the main and peaking amplifiers, respectively.

The power splitter 902 is configured to split the power of the input RF signal received through the landing pad 901 into first and second RF signals, which are produced at the output terminals of the power splitter 902. In addition, the power splitter 902 may include one or more phase shift elements configured to impart about a 90 degree phase difference between the RF signals provided at the output terminals. The first and second RF signals produced at the outputs of the power splitter 902 may have equal or unequal power.

The first output of the power splitter is electrically coupled to a main amplifier path (i.e., to the main amplifier), and the second output of the power splitter is electrically coupled to a peaking amplifier path (i.e., to the peaking amplifier). In the illustrated embodiment, the RF signal produced at the second power splitter output is delayed by about 90 degrees from the RF signal produced at the first power splitter output. In other words, the RF signal provided to the peaking amplifier path is delayed by about 90 degrees from the RF signal provided to the main amplifier path.

The first RF signal produced by the power splitter 902 is amplified through the main amplifier path, which includes the silicon driver stage IC die 910, the GaN final stage IC die 980, and a phase shift element 903. The second RF signal produced by the power splitter 902 is amplified through the peaking amplifier path, which includes the silicon driver stage IC die 911, the GaN final stage IC die 981.

The silicon driver stage IC die 910 and the GaN final stage IC die 980 of the main amplifier path are electrically coupled together in a cascade arrangement between an input terminal 920 of the silicon driver stage IC die 910 (corresponding to a main amplifier input) and an output terminal 992 of the GaN final stage IC die 980 (corresponding to a main amplifier output). The silicon driver stage IC die 910 includes a plurality of integrated circuits. In an embodiment, the integrated circuitry of die 910 includes the input terminal 920 (e.g., input terminal 120, 220, 902, 420), an output terminal 922 (e.g., output terminal 122, 222, 322, 422), an input impedance matching circuit 930 (e.g., circuit 130, 230, 330, 430), a silicon power transistor 940 (e.g., transistor 140, 240, 340-344, 440), an integrated portion of an interstage impedance matching circuit 950 (e.g., circuit 150, 250, 350, 450), a bias voltage control circuit 960 (e.g., circuit 160, 260, 360, 460), and an integrated portion of a harmonic control circuit 970 (e.g., circuit 170, 270, 370, 470), in an embodiment. The various circuits and components within the silicon driver stage IC die 910 may be configured and electrically coupled together as described previously in conjunction with FIGS. 1-5.

The first output of the power divider 902 is electrically coupled to the input terminal 920 of the silicon driver stage IC die 910 through various conductive traces, circuitry, and wirebonds or other types of electrical connections (e.g., corresponding to connection 203, 303, 403). A bias land 958 is electrically coupled through additional conductive structures, a wirebond (or other types of electrical connections), and a terminal (e.g., terminals 158, 258, 358 or 458) to corresponding bias voltage control circuitry 960 for the GaN transistor 982. Although not shown in FIG. 9, additional bias lands may be electrically coupled to bias voltage control circuitry for the silicon transistor gate and drain.

The GaN final stage IC die 980 includes a plurality of integrated circuits. In an embodiment, the integrated circuitry of die 980 includes an input terminal 990 (e.g., input terminal 190, 290, 390, 490), an output terminal 992 (e.g., output terminal 192, 292, 392, 492), and a GaN power transistor 982 (e.g., transistor 182, 282, 382, 482). The various circuits and components within the GaN final stage IC die 980 may be configured and electrically coupled together as described previously in conjunction with FIGS. 1-5.

The output terminal 922 of the silicon driver stage IC die 910 is electrically coupled to the input terminal 990 of the GaN final stage IC die 980 through a wirebond array 974 or another type of electrical connection (e.g., corresponding to connections 174, 274, 374, 474). The input terminal 990 is electrically coupled to the gate of the GaN power transistor 982. The gate of the GaN power transistor 982 also is electrically coupled through one or more wirebonds 978 or another type of electrical connection (e.g., corresponding to connections 178, 278, 378, 478) to the integrated portion of a harmonic control circuit 970 in the silicon driver stage IC die 910.

The amplified first RF signal is produced at the output terminal 992 of the GaN final stage IC die 980. According to an embodiment, the output terminal 992 is electrically coupled (e.g., through wirebonds 979 or another type of electrical connection) to phase shift element 903. According to an embodiment, phase shift element 903 has a first end that is proximate to the output terminal 992 of the GaN final stage IC die 980, and a second end that is proximate to the output terminal 993 of the GaN final stage IC die 981. For example, the phase shift element 903 may be implemented with a lambda/4 ($\lambda/4$) transmission line (e.g., a microstrip transmission line with a 90-degree electrical length) that extends between its first and second ends. The phase shift element 903 may impart about a 90 degree relative phase shift to the amplified first RF signal as the signal travels from the phase shift element's first end to its second end.

As mentioned above, the second RF signal produced by the power splitter 902 is amplified through the peaking amplifier path, which includes the silicon driver stage IC die 911, the GaN final stage IC die 981. The silicon driver stage IC die 911 and the GaN final stage IC die 981 of the peaking amplifier path are electrically coupled together in a cascade arrangement between an input terminal 921 of the silicon driver stage IC die 911 (corresponding to a peaking amplifier input) and an output terminal 993 of the GaN final stage IC die 981 (corresponding to a peaking amplifier output). The silicon driver stage IC die 911 includes a plurality of integrated circuits. In an embodiment, the integrated circuitry of die 911 includes the input terminal 921 (e.g., input terminal 120, 220, 902, 420), an output terminal 923 (e.g., output terminal 122, 222, 322, 422), an input impedance matching circuit 931 (e.g., circuit 130, 230, 330, 430), a silicon power transistor 941 (e.g., transistor 140, 240, 340-344, 440), an integrated portion of an interstage impedance matching circuit 951 (e.g., circuit 150, 250, 350, 450), a bias voltage control circuit 961 (e.g., circuit 160, 260, 360, 460), and an integrated portion of a harmonic control circuit 971 (e.g., circuit 170, 270, 370, 470), in an embodiment. The various circuits and components within the silicon driver stage IC die 911 may be configured and electrically coupled together as described previously in conjunction with FIGS. 1-5.

The second output of the power divider 902 is electrically coupled to the input terminal 921 of the silicon driver stage IC die 911 through various conductive traces, circuitry, and wirebonds or another type of electrical connection (e.g., corresponding to connection 203, 303, 403). A bias land 959 is electrically coupled through additional conductive structures, a wirebond (or another type of electrical connection), and a terminal (e.g., terminals 158, 258, 358 or 458) to corresponding bias voltage control circuitry 961 for the GaN transistor 983. Although not shown in FIG. 9, additional bias lands may be electrically coupled to bias voltage control circuitry for the silicon transistor gate and drain.

The GaN final stage IC die 981 includes a plurality of integrated circuits. In an embodiment, the integrated circuitry of die 981 includes an input terminal 991 (e.g., input terminal 190, 290, 390, 490), an output terminal 993 (e.g., output terminal 192, 292, 392, 492), and a GaN power transistor 983 (e.g., transistor 182, 282, 382, 482). The various circuits and components within the GaN final stage IC die 981 may be configured and electrically coupled together as described previously in conjunction with FIGS. 1-5.

The output terminal 923 of the silicon driver stage IC die 911 is electrically coupled to the input terminal 991 of the GaN final stage IC die 981 through a wirebond array 975 or another type of electrical connection (e.g., corresponding to connections 174, 274, 374, 474). The input terminal 991 is electrically coupled to the gate of the GaN power transistor 983. The gate of the GaN power transistor 983 also is electrically coupled through one or more wirebonds 977 or another type of electrical connection (e.g., corresponding to connections 178, 278, 378, 478) to the integrated portion of a harmonic control circuit 971 in the silicon driver stage IC die 911.

The signal path through the cascade-coupled peaking amplifier dies 911, 981 is in a direction extending from the RF input terminal 921 to the RF output terminal 993, which direction is indicated by arrow 913. Conversely, the signal path through the cascade-coupled main amplifier dies 910, 980 is in a direction extending from the silicon driver stage IC die input terminal 920 to the GaN final stage IC die output terminal 992, which direction is indicated by arrow 911. As can be seen in FIG. 9, the signal paths through the cascade-coupled peaking amplifier dies 911, 981 and the cascade-coupled main amplifier dies 910, 980 extend in significantly different directions, and more particularly the signal paths are orthogonal in the embodiment of FIG. 9. Said another way, the RF signal path through the dies 911, 981 is orthogonal to the RF signal path through the dies 910, 980. Even though the die 910, 911, 980, 981 may be positioned relatively close together, their orthogonal orientations may significantly reduce coupling between signals carried through and amplified by the main and peaking amplifier paths.

In any event, the amplified second RF signal is produced by the GaN final stage IC die 981 at the RF output terminal 993. According to an embodiment, the RF output terminal 993 is electrically coupled (e.g., through wirebonds 904 or another type of electrical connection) to the second end of the phase shift element 903. Accordingly, the amplified first RF signal produced by the GaN final stage IC die 980 is conveyed to the RF output terminal 993, and the output terminal 993 functions as a summing node 905 for the amplified first and second RF signals. When the various phase shifts imparted separately on the first and second RF signals are substantially equal, the amplified first and second RF signals combine substantially in phase at summing node 905.

The RF output terminal 993 (and thus summing node 905) is electrically coupled (e.g., through wirebonds 907 or another type of electrical connection) to an output network 908, which functions to present the proper load impedances to each of main and peaking amplifier dies 980, 981. In addition, the output network 908 may include a decoupling capacitor, as shown. Although the detail is not shown in FIG. 9, the output network 908 may include various conductive traces, additional discrete components, and/or integrated components (e.g., capacitors, inductors, and/or resistors) to provide the desired impedance matching. The output network 908 is electrically coupled through the PCB 906 to conductive landing pad 909 exposed at the bottom surface of the PCB 906. The landing pad 909 functions as the RF output node for the Doherty power amplifier module 900.

An embodiment of a multiple-stage amplifier includes a first die, a second die, and a connection between the dies. The first die includes a III-V semiconductor substrate, a first RF signal input terminal, a first RF signal output terminal, and a first transistor. The first transistor has a control terminal electrically coupled to the first RF signal input terminal, and a current-carrying terminal electrically coupled to the first RF signal output terminal. The second die includes a second type of semiconductor substrate, a second RF signal input terminal, a second RF signal output terminal, a first secondary circuit, and an amplification path between the second RF signal input terminal and the second RF signal output terminal. The amplification path includes a second transistor with a control terminal and a current-carrying terminal. The control terminal of the second transistor is electrically coupled to the second RF signal input terminal, and the current-carrying terminal of the second transistor is electrically coupled to the second RF signal output terminal. The first secondary circuit is electrically coupled to the control terminal of the first transistor, and the first secondary circuit is selected from a final stage bias circuit and a final stage harmonic control circuit. The connection is electrically coupled between the second RF signal output terminal and the first RF signal input terminal.

The preceding detailed description is merely illustrative in nature and is not intended to limit the embodiments of the subject matter or the application and uses of such embodiments. For example, although the above description discusses the use of a GaN final stage IC die in various embodiments, other types of III-V transistors (e.g., GaAs transistors, InP transistors, and so on) may be used as a final stage IC die, in other embodiments.

As used herein, the word "exemplary" means "serving as an example, instance, or illustration." Any implementation described herein as exemplary is not necessarily to be construed as preferred or advantageous over other implementations. Furthermore, there is no intention to be bound by any expressed or implied theory presented in the preceding technical field, background, or detailed description.

The connecting lines shown in the various figures contained herein are intended to represent exemplary functional relationships and/or physical couplings between the various elements. It should be noted that many alternative or additional functional relationships or physical connections may be present in an embodiment of the subject matter. In addition, certain terminology may also be used herein for the purpose of reference only, and thus are not intended to be limiting, and the terms "first", "second" and other such numerical terms referring to structures do not imply a sequence or order unless clearly indicated by the context.

As used herein, a "node" means any internal or external reference point, connection point, junction, signal line, conductive element, or the like, at which a given signal, logic level, voltage, data pattern, current, or quantity is present. Furthermore, two or more nodes may be realized by one physical element (and two or more signals can be multiplexed, modulated, or otherwise distinguished even though received or output at a common node).

The foregoing description refers to elements or nodes or features being "connected" or "coupled" together. As used herein, unless expressly stated otherwise, "connected" means that one element is directly joined to (or directly communicates with) another element, and not necessarily mechanically. Likewise, unless expressly stated otherwise, "coupled" means that one element is directly or indirectly joined to (or directly or indirectly communicates with, electrically or otherwise) another element, and not necessarily mechanically. Thus, although the schematic shown in the figures depict one exemplary arrangement of elements, additional intervening elements, devices, features, or components may be present in an embodiment of the depicted subject matter.

While at least one exemplary embodiment has been presented in the foregoing detailed description, it should be appreciated that a vast number of variations exist. It should also be appreciated that the exemplary embodiment or embodiments described herein are not intended to limit the scope, applicability, or configuration of the claimed subject matter in any way. Rather, the foregoing detailed description will provide those skilled in the art with a convenient road map for implementing the described embodiment or embodiments. It should be understood that various changes can be made in the function and arrangement of elements without departing from the scope defined by the claims, which includes known equivalents and foreseeable equivalents at the time of filing this patent application.

What is claimed is:

1. A multiple-stage amplifier comprising:
a first die that includes a III-V semiconductor substrate, a first radio frequency (RF) signal input terminal, a first RF signal output terminal, and a first transistor, wherein the first transistor has a control terminal electrically coupled to the first RF signal input terminal, and a current-carrying terminal electrically coupled to the first RF signal output terminal;
a second die that includes a second type of semiconductor substrate, a second RF signal input terminal, a second RF signal output terminal, a first secondary circuit comprising a final stage bias circuit for the first transistor in the first die, a decoupling capacitor, and an amplification path between the second RF signal input terminal and the second RF signal output terminal, wherein the amplification path includes a second transistor and the decoupling capacitor, wherein the second transistor has a control terminal and a current-carrying terminal, the control terminal of the second transistor is electrically coupled to the second RF signal input terminal, the current-carrying terminal of the second transistor is electrically coupled to a first terminal of the decoupling capacitor, and a second terminal of the decoupling capacitor is electrically coupled to the final stage bias circuit for the first transistor and to the second RF signal output terminal, and wherein the final stage bias circuit for the first transistor is electrically coupled to the control terminal of the first transistor and not coupled to the control terminal of the second transistor; and
a first connection electrically coupled between the second RF signal output terminal and the first RF signal input terminal, and wherein the multiple-stage amplifier is configured to provide a bias voltage to the control terminal of the first transistor through the final stage bias circuit of the second die, the second RF signal output terminal, the first connection, and the first RF signal input terminal of the first die.

2. The amplifier of claim 1, wherein:
the second die further includes a first secondary circuit terminal configured to be electrically coupled to an external bias voltage source, and
the final stage bias circuit, is electrically coupled between the first secondary circuit terminal and the second RF signal output terminal.

3. The amplifier of claim 2, wherein the final stage bias circuit comprises:
a direct current-to-direct current (DC-DC) voltage converter electrically coupled between the first secondary circuit terminal and the second RF signal output terminal.

4. The amplifier of claim 3, wherein the DC-DC voltage converter is configured to convert a first DC voltage provided to the first secondary circuit terminal into a negative DC voltage at the second RF signal output terminal.

5. The amplifier of claim 2, wherein the final stage bias circuit comprises:
an inductor integrated in the second die and electrically coupled between the first secondary circuit terminal and the second RF signal output terminal.

6. The amplifier of claim 2, further comprising:
a driver stage bias control circuit electrically coupled to the current-carrying terminal of the second transistor and to the first terminal of the decoupling capacitor.

7. The amplifier of claim 2, wherein the second die further comprises:
a second secondary circuit terminal;
a second secondary circuit in the form of a final stage harmonic control circuit, which is electrically coupled between the second secondary circuit terminal and a ground node; and
a second connection electrically coupled between the second secondary circuit terminal and the first transistor.

8. The amplifier of claim 7, wherein the final stage harmonic control circuit comprises:
a second capacitor with a first terminal and a second terminal, wherein the first terminal of the second capacitor is electrically coupled to the second secondary circuit terminal, and the second terminal of the second capacitor is electrically coupled to the ground node, and wherein a combination of the second connection and the second capacitor forms a series inductor-capacitor (LC) harmonic termination circuit, which provides a low impedance path to the ground node for signal energy at a second harmonic, 2f 0, of a center operating frequency, f0, of the amplifier.

9. The amplifier of claim 1, wherein the second die further comprises:
an integrated portion of an interstage impedance matching circuit electrically coupled between the current-carrying terminal of the second transistor and the second RF signal output terminal, wherein the first connection is a non-integrated portion of the interstage impedance matching circuit.

10. The amplifier of claim 1, wherein:
the III-V substrate is selected from a gallium nitride (GaN) substrate, a GaN-on-silicon substrate, and a GaN-on-silicon carbide substrate; and
the second type of semiconductor substrate is selected from a silicon substrate, and a silicon-on-insulator substrate.

11. The amplifier of claim 1, wherein the first die includes a GaN field effect transistor (FET) and the second transistor includes a silicon laterally-diffused metal oxide semiconductor (LDMOS) field effect transistor (FET).

12. The amplifier of claim 1, wherein the first die includes a GaN field effect transistor (FET) and the second transistor includes a silicon, complementary metal oxide semiconductor (CMOS) cascode stack.

13. The amplifier of claim 1, wherein:
the amplifier is a Doherty power amplifier that includes a main amplifier and a peaking amplifier, and
the main amplifier includes the first and second die, wherein the second RF signal input terminal of the second die corresponds to a main amplifier input, and the first RF signal output terminal of the first die corresponds to a main amplifier output.

14. The amplifier of claim 1, wherein the first connection includes a connection that is selected from a wirebond array, a microstrip line, a printed coil, and a parallel-coupled resistor/capacitor circuit.

15. A multiple-stage amplifier comprising:
a first die that includes a III-V semiconductor substrate, a first radio frequency (RF) signal input terminal, a first RF signal output terminal, and a first transistor, wherein the first transistor has a control terminal electrically coupled to the first RF signal input terminal, and a current-carrying terminal electrically coupled to the first RF signal output terminal;
a second die that includes a second type of semiconductor substrate, a second RF signal input terminal, a second RF signal output terminal, a first secondary circuit comprising a final stage harmonic control circuit, a first secondary circuit terminal coupled to the final stage harmonic control circuit, and an amplification path between the second RF signal input terminal and the second RF signal output terminal, wherein the amplification path includes a second transistor with a control terminal and a current-carrying terminal, the control terminal of the second transistor is electrically coupled to the second RF signal input terminal, and the current-carrying terminal of the second transistor is electrically coupled to the second RF signal output terminal, and wherein the final stage harmonic control circuit is electrically coupled to the control terminal of the first transistor and not coupled to the control terminal of the second transistor;
a first connection electrically coupled between the second RF signal output terminal and the first RF signal input terminal; and
a second connection electrically coupled between the first secondary circuit terminal and the first transistor, and
wherein the final stage harmonic control circuit, is electrically coupled between the first secondary circuit terminal and a ground node.

16. The amplifier of claim 15, wherein the final stage harmonic control circuit comprises:
a capacitor with a first terminal and a second terminal, wherein the first terminal is electrically coupled to the first secondary circuit terminal, and the second terminal is electrically coupled to the ground node, and wherein a combination of the second connection and the capacitor forms a series inductor-capacitor (LC) harmonic termination circuit, which provides a low impedance path to the ground node for signal energy at a second harmonic, 2f0, of a center operating frequency, f0, of the amplifier.

17. The amplifier of claim 15, wherein the second die further comprises:
a second secondary circuit terminal configured to be electrically coupled to an external bias voltage source; and
a second secondary circuit in the form of the final stage bias circuit, which is electrically coupled between the second secondary circuit terminal and the second RF signal output terminal.

18. The amplifier of claim 17, wherein the final stage bias circuit comprises:
a direct current-to-direct current (DC-DC) voltage converter electrically coupled between the first secondary circuit terminal and the second RF signal output terminal, wherein the DC-DC voltage converter is configured to convert a first DC voltage provided to the first secondary circuit terminal into a negative DC voltage at the second RF signal output terminal.

19. The amplifier of claim 17, wherein the final stage bias circuit comprises:
an inductor integrated in the second die and electrically coupled between the second secondary circuit terminal and the second RF signal output terminal.

20. The amplifier of claim 17, further comprising:
a driver stage bias control circuit electrically coupled to the current-carrying terminal of the second transistor; and
a decoupling capacitor with a first terminal electrically coupled to the current-carrying terminal of the second transistor, and a second terminal electrically coupled to the final stage bias circuit and to the second RF signal output terminal.

* * * * *